(12) United States Patent
Soejima

(10) Patent No.: US 11,656,078 B2
(45) Date of Patent: May 23, 2023

(54) SENSOR ELEMENT AND ANGULAR VELOCITY SENSOR

(71) Applicant: KYOCERA Corporation, Kyoto (JP)

(72) Inventor: Munetaka Soejima, Soraku-gun (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/641,944

(22) PCT Filed: Aug. 24, 2018

(86) PCT No.: PCT/JP2018/031350
§ 371 (c)(1),
(2) Date: Feb. 25, 2020

(87) PCT Pub. No.: WO2019/044697
PCT Pub. Date: Mar. 7, 2019

(65) Prior Publication Data
US 2020/0249021 A1    Aug. 6, 2020

(30) Foreign Application Priority Data
Aug. 29, 2017  (JP) .............................. JP2017-164322

(51) Int. Cl.
*G01C 19/5642* (2012.01)
*G01C 19/5628* (2012.01)
*G01C 19/5607* (2012.01)

(52) U.S. Cl.
CPC ..... *G01C 19/5642* (2013.01); *G01C 19/5607* (2013.01); *G01C 19/5628* (2013.01)

(58) Field of Classification Search
CPC ............ G01P 19/5642; G01C 19/5649; G01C 19/5656; G01C 19/5663; G01C 19/5607; G01C 19/5614; G01C 19/5621; G01C 19/5628
See application file for complete search history.

(56) References Cited

U.S. PATENT DOCUMENTS

| | | | | |
|---|---|---|---|---|
| 6,046,531 A * | 4/2000 | Kikuchi | ............. | G01C 19/5621 310/311 |
| 6,119,518 A * | 9/2000 | Itou | ..................... | G01C 19/5607 73/504.16 |
| 2003/0066350 A1 | 4/2003 | Machida et al. | | |
| 2006/0090565 A1* | 5/2006 | Ohuchi | .............. | G01C 19/5607 73/504.16 |

(Continued)

FOREIGN PATENT DOCUMENTS

| JP | 2003-185441 A | 7/2003 |
|---|---|---|
| JP | 2009-156832 A | 7/2009 |

(Continued)

OTHER PUBLICATIONS

English Translation of JP 2015-094716.*

*Primary Examiner* — Helen C Kwok
(74) *Attorney, Agent, or Firm* — Volpe Koenig

(57) ABSTRACT

A sensor element includes a piezoelectric body and a plurality of electrodes. The piezoelectric body, when viewed on a plane, includes a base part and at least one arm part extending from the base part. The plurality of electrodes are located on a surface of the arm part. The piezoelectric body, when viewed on the plane, further includes a frame part which surrounds the base part and the at least one arm part and upon which the base part is bridged.

12 Claims, 10 Drawing Sheets

(56) References Cited

U.S. PATENT DOCUMENTS

| | | | | |
|---|---|---|---|---|
| 2006/0107739 A1* | 5/2006 | Ogura | ................ | G01C 19/5607 |
| | | | | 73/504.12 |
| 2006/0162447 A1* | 7/2006 | Ogura | ................ | G01C 19/5607 |
| | | | | 73/504.12 |
| 2008/0148848 A1* | 6/2008 | Noguchi | ............ | G01C 19/5607 |
| | | | | 73/504.16 |
| 2009/0165556 A1 | 7/2009 | Unno et al. | | |
| 2013/0205898 A1* | 8/2013 | Nakagawa | .......... | H01L 41/0475 |
| | | | | 73/504.16 |
| 2015/0381143 A1* | 12/2015 | Matsuo | .................. | H03H 9/215 |
| | | | | 310/370 |
| 2018/0274922 A1* | 9/2018 | Nishizawa | ......... | G01C 19/5621 |
| 2019/0265033 A1* | 8/2019 | Soejima | .................. | H01L 41/09 |
| 2020/0217663 A1* | 7/2020 | Soejima | ................ | H01L 41/042 |

FOREIGN PATENT DOCUMENTS

| | | | |
|---|---|---|---|
| JP | 2015-094716 | * | 5/2015 |
| JP | 2015-099130 A | | 5/2015 |
| JP | 2015-141184 A | | 8/2015 |
| JP | 2016-173378 A | | 9/2016 |

* cited by examiner

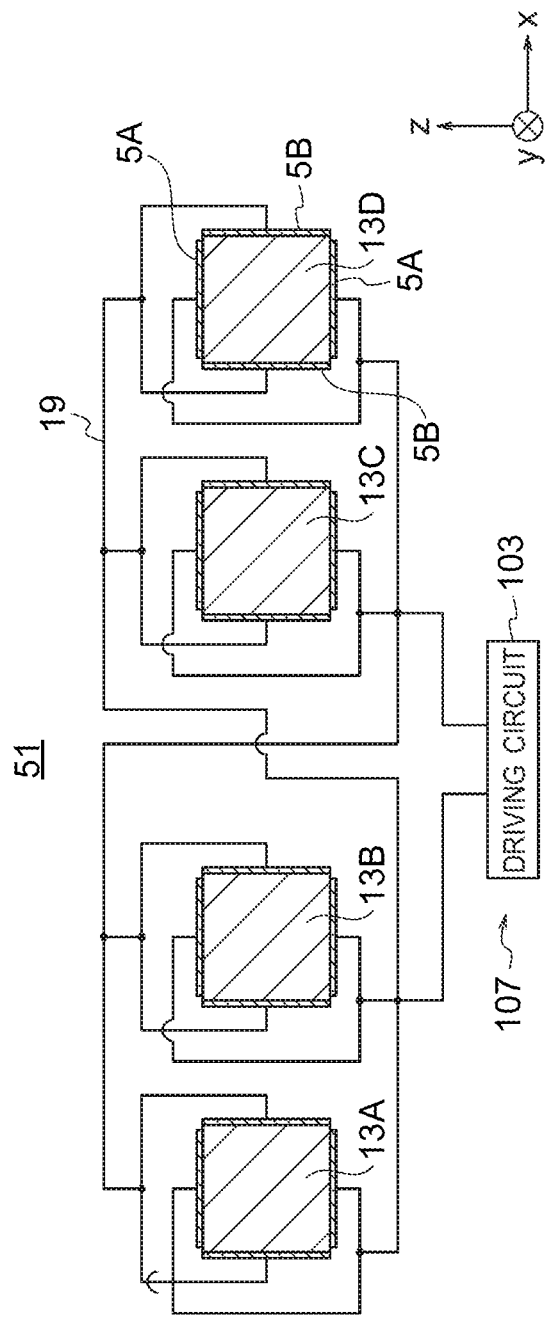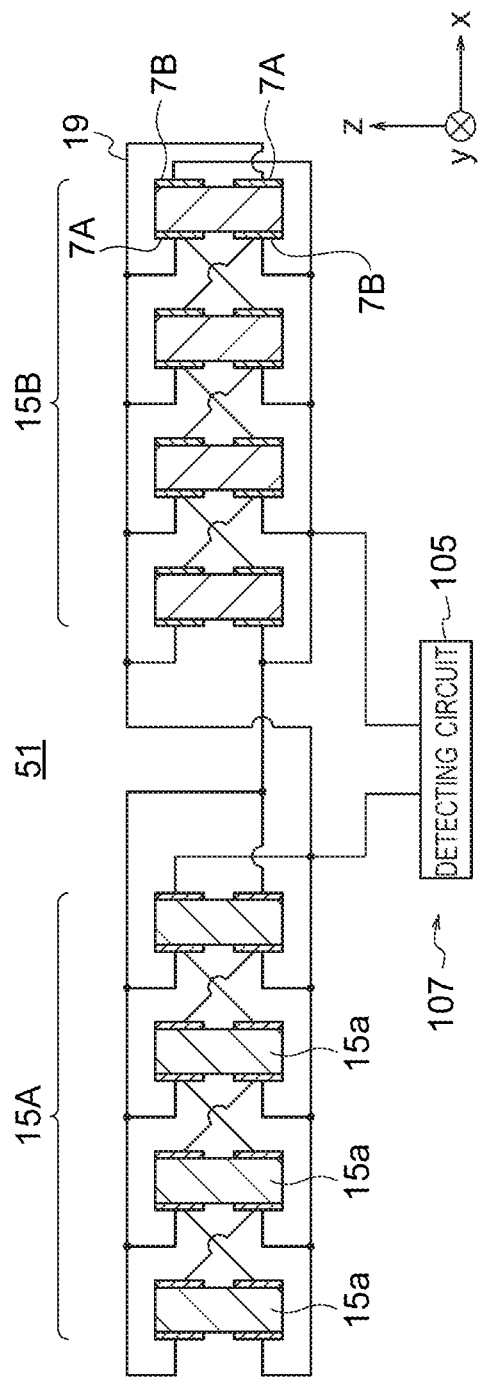

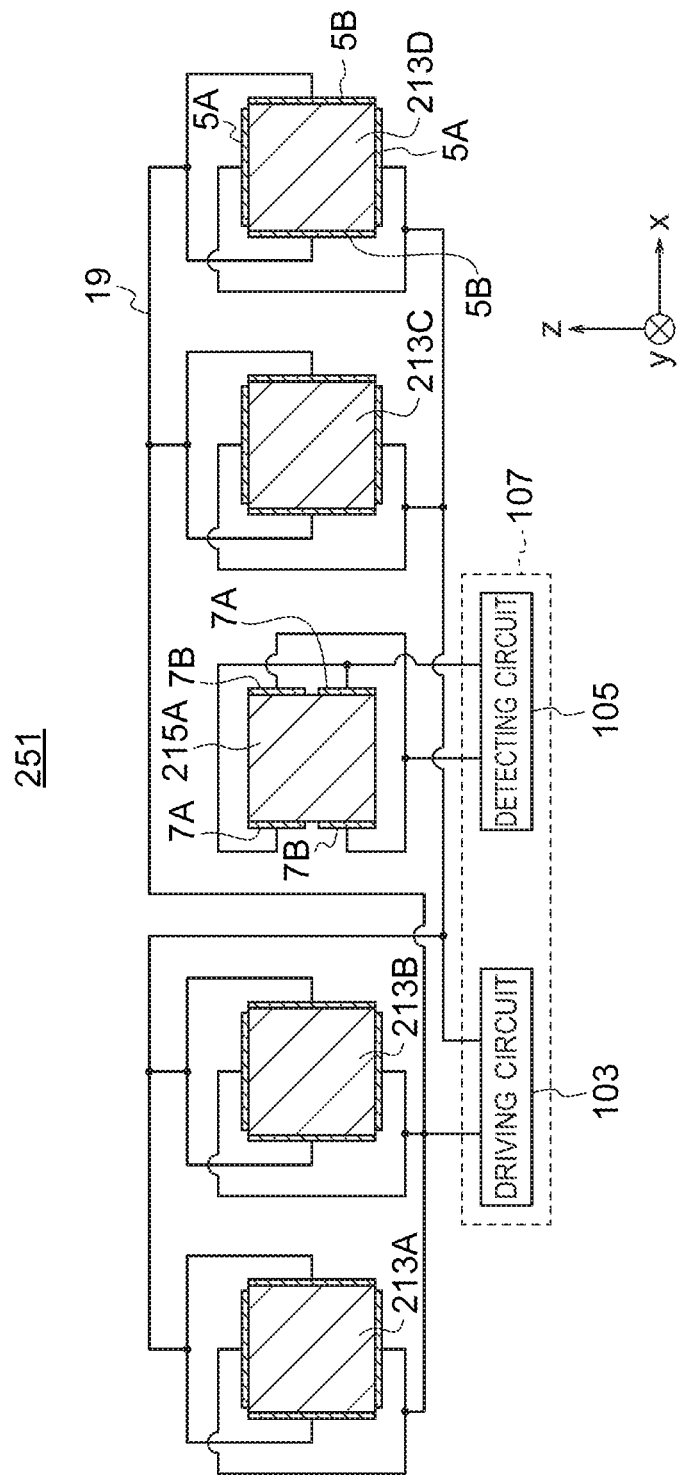

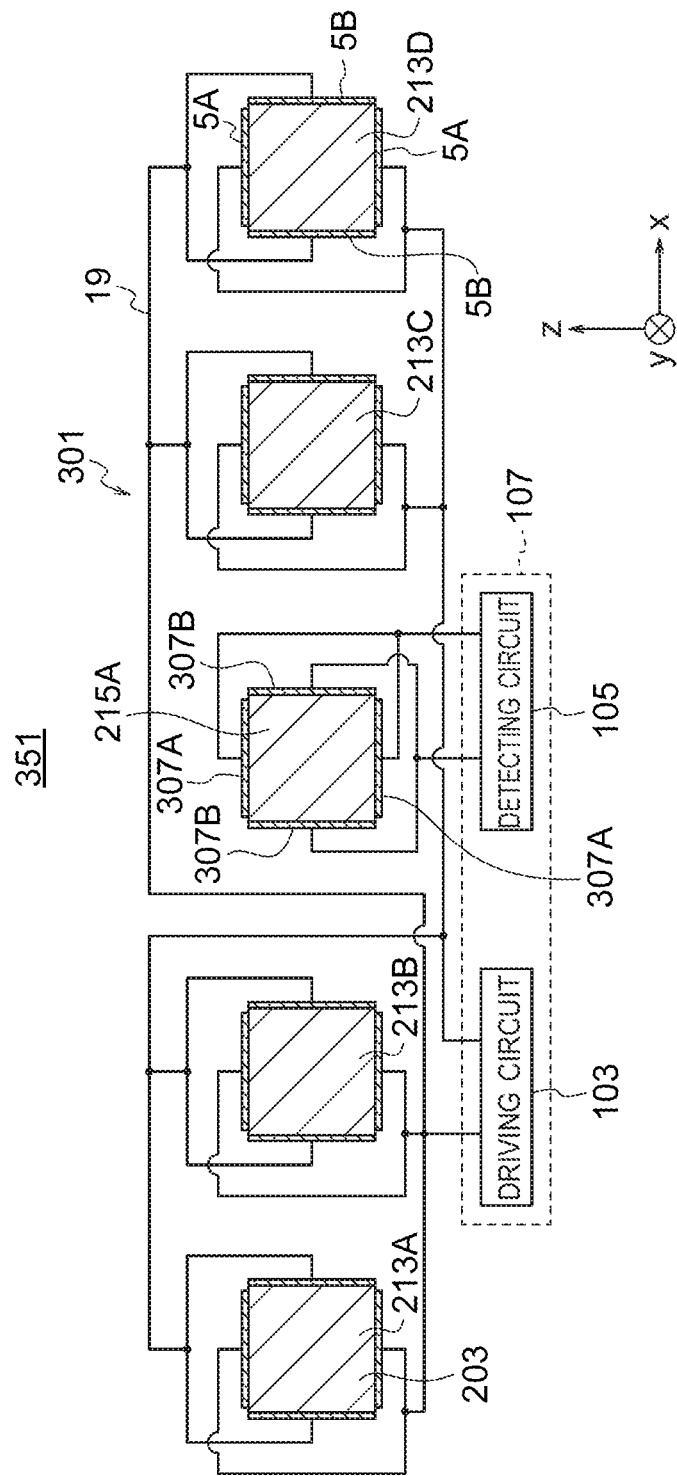

SENSOR ELEMENT AND ANGULAR VELOCITY SENSOR

TECHNICAL FIELD

The present disclosure relates to a sensor element used for detection of an angular velocity and an angular velocity sensor including the sensor element.

BACKGROUND ART

Known in the art as an angular velocity sensor is a vibration type gyroscope (for example, Patent Literature 1 or 2). Such an angular velocity sensor for example has a vibrator which includes a base part and one or more arm parts extending from the base part. When the vibrator is rotated in a state where the arm part is excited, a Coriolis force is generated with a magnitude in accordance with the rotation speed (angular velocity) in a direction perpendicular to an excitation direction and to a rotation axis. The arm part vibrates due to this Coriolis force as well. Further, the angular velocity can be detected by detecting an electrical signal generated in accordance with deformation of the arm part due to the Coriolis force.

In Patent Literature 1, the base part and a plurality of arm parts are integrally formed by a piezoelectric body. Further, electrodes are provided on surfaces of the arm parts configured by the piezoelectric body. Due to this, excitation of the arm parts or detection of a signal in accordance with the deformation of the arm parts is enabled. Further, in Patent Literature 1, the base part is supported by arm-shaped portions which are integrally formed by the piezoelectric body together with the base part.

In Patent Literature 2, the base part and the plurality of arm parts are integrally formed by silicon. Further, a piezoelectric body and electrodes are superposed on the surfaces of the arm parts. Due to this, excitation of the arm parts is enabled or detection of a signal in accordance with the deformation of the arm parts is enabled. In Patent Literature 2, the base part is supported by arm-shaped portions which are integrally formed by silicon together with the base part.

CITATION LIST

Patent Literature

Patent Literature 1: Japanese Patent Publication No. 2015-141184
Patent Literature 2: Japanese Patent Publication No. 2003-185441

SUMMARY OF INVENTION

A sensor element according to one aspect of the present disclosure includes a piezoelectric body and a plurality of electrodes. The piezoelectric body, when viewed on a plane, includes a base part and at least one arm part extending from the base part. The plurality of electrodes are located on a surface of the arm part. The piezoelectric body, when viewed on the plane, further includes a frame part which surrounds the base part and the at least one arm part and upon which the base part is bridged.

An angular velocity sensor according to one aspect of the present disclosure includes the sensor element described above, a driving circuit supplying voltage to part of the plurality of electrodes, and a detecting circuit detecting a signal from another part of the plurality of electrodes.

BRIEF DESCRIPTION OF DRAWINGS

FIG. 3A is a cross-sectional view taken along the IIIa-IIIa line in FIG. 2,
and FIG. 3B is a cross-sectional view taken along the IIIb-IIIb line in FIG. 2.
FIG. 5 is a cross-sectional view taken along the V-V line in FIG. 4.
FIG. 7 is a cross-sectional view showing the configuration of a principal part of a sensor element according to a third embodiment.

DESCRIPTION OF EMBODIMENTS

Below, embodiments according to the present disclosure will be explained with reference to the drawings. The following drawings are schematic ones. Therefore, details will be sometimes omitted. Further, size ratios etc. do not always coincide with the actual ones. Further, size ratios in the plurality of drawings do not always coincide with each other.

Further, to each of the drawings, for convenience of explanation, an orthogonal coordinate system xyz is attached. The orthogonal coordinate system xyz is defined based on the shape of the sensor element (piezoelectric body). That is, the x-axis, y-axis, and z-axis do not always indicate an electrical axis, mechanical axis, and optical axis of a crystal. The sensor element may be used so that any direction is defined as "above" or "below". In the following explanation, however, for convenience, sometimes the "upper surface" or "lower surface" and other terms will be used where the positive side in the z-axis direction is the upper part. Further, when simply referred to as "when viewed on a plane", it means "viewed in the z-axis direction" unless particularly explained otherwise.

Further, the same or similar configurations sometimes are assigned additional notations of letters of the alphabet which are different from each other such as with the "driving arm 13A" and "driving arm 13B". Further, in this case, sometimes the configurations will be simply referred to as the "driving arms 13" and will not be differentiated.

In the second and following embodiments, configurations which are common or similar to the configurations in the already explained embodiments use notations which were attached to the configurations in the already explained embodiments. Further, sometimes illustration and explanations will be omitted. For configurations corresponding (similar) to the configurations in the already explained embodiments, even in a case where notations which are different from those for the configurations in the already explained embodiments are attached, the matters are the same configurations as those in the already explained embodiments unless particularly explained otherwise.

First Embodiment (Overall Configuration of Sensor Element)

Figure 1:
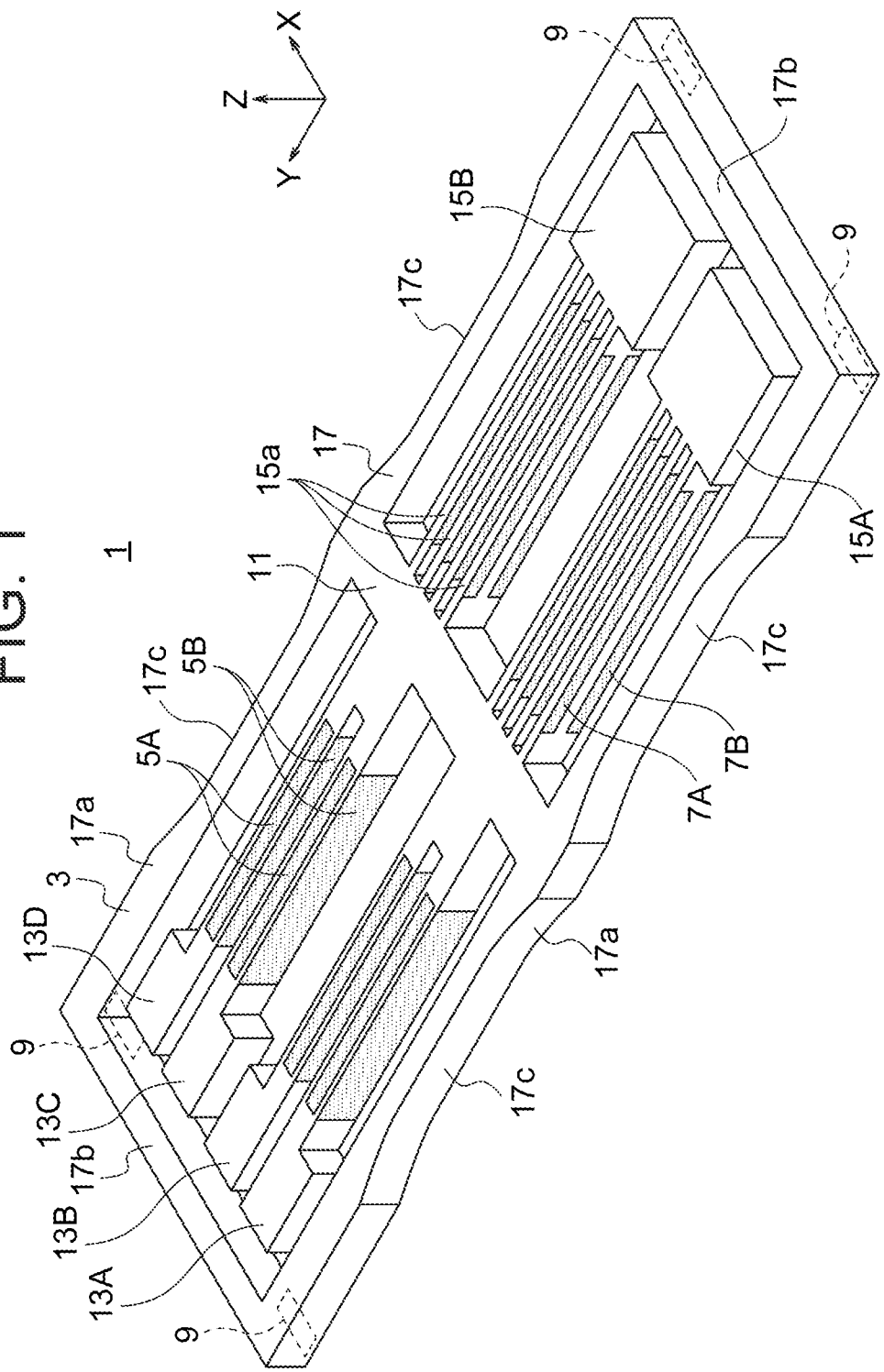
FIG. 1 is a perspective view showing the configuration of a principal part of a sensor element according to a first embodiment.
Figure 2:
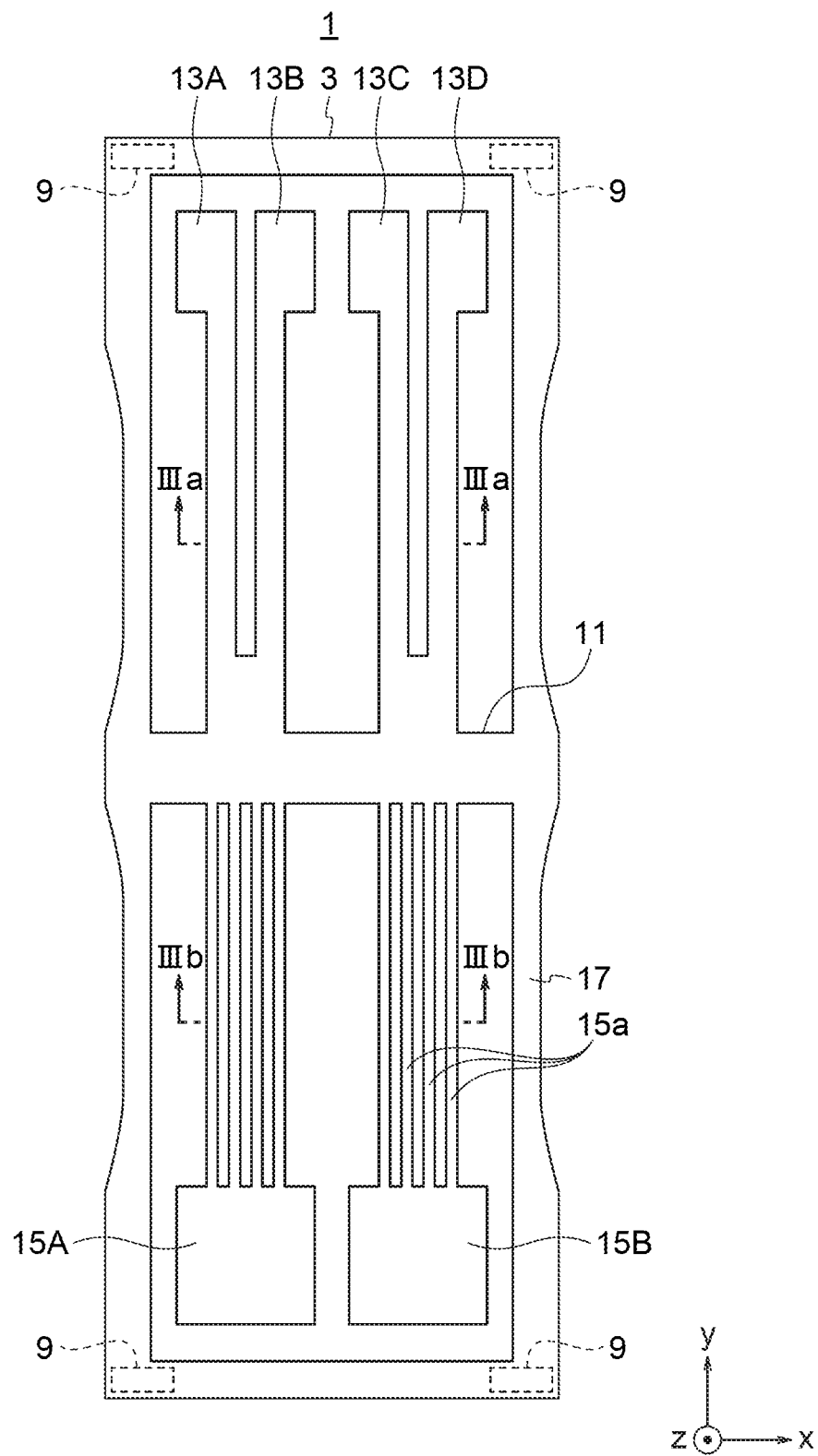
FIG. 2 is a plan view showing the configuration of a principal part of the sensor element in FIG. 1.

FIG. 1 is a perspective view showing the configuration of a principal part of a sensor element 1 in an angular velocity sensor 51 (notation is shown in FIG. 3A) according to a first embodiment of the present disclosure. FIG. 2 is a plan view showing the configuration of a principal part of the sensor element 1. FIG. 2 furthermore omits illustration of conductive layers (5A etc.) more than FIG. 1.

The angular velocity sensor 51 according to the present embodiment may be made the same as the angular velocity sensor disclosed in Patent Literature 1 except for the frame part 17 which will be explained later. Accordingly, in the explanation of the first embodiment, sometimes explanation of details will be omitted for configurations other than the frame part 17.

The sensor element 1 is one for detecting the angular velocity around the y-axis and is configured so that by being excited in the x-axis direction and being rotated around the y-axis, a Coriolis force with a magnitude in accordance with the angular velocity is generated in the z-axis direction. Specifically, for example, this is as follows.

The sensor element 1 has a piezoelectric body 3, an excitation electrode 5A and excitation electrode 5B (FIG. 1) for supplying voltages to the piezoelectric body 3, a detecting electrode 7A (FIG. 1) and detecting electrode 7B (FIG. 1) for extracting electrical signals generated in the piezoelectric body 3, and pads 9 for mounting the sensor element 1 on a not shown mounting body (for example a portion of a package or a circuit board).

The additional notations A and B are attached to the excitation electrodes 5 and detecting electrodes 7 based on the orthogonal coordinate system xyz. Accordingly, as will be explained later, one excitation electrode 5A and another excitation electrode 5A do not always have the same potential. The same is true for the excitation electrode 5B and detecting electrodes 7A and 7B.

The excitation electrodes 5, detecting electrodes 7, pads 9, and wirings 19 (FIG. 3A and FIG. 3B) which connect them are configured by conductor layers provided on the surface of the piezoelectric body 3. Their materials are for example Cu, Al, or another suitable metal. These conductor layers may be configured by stacking layers which are made of different materials from each other as well.

(Piezoelectric Body)

The piezoelectric body 3 is integrally formed as a whole. The piezoelectric body 3 may be a single crystal or polycrystal. Further, the material for the piezoelectric body 3 may be suitably selected. For example, it is a quartz crystal ($SiO_2$), $LiTaO_3$, $LiNbO_3$, or PZT.

In the piezoelectric body 3, the electrical axis or polarization axis (below, sometimes only the polarization axis referred to as a representative of the two) is set so as to match with the x-axis. The polarization axis may be inclined relative to the x-axis within a predetermined range (for example within 15°) as well. Further, in a case where the piezoelectric body 3 is a single crystal, the mechanical axis and optical axis may be made suitable directions. For example, the mechanical axis is made the y-axis direction and the optical axis is made the z-axis direction.

The piezoelectric body 3, for example, is made constant in thickness (z-axis direction) as a whole. Further, the piezoelectric body 3 is for example formed in substantially a line symmetrical shape relative to a not shown symmetrical axis parallel to the y-axis. Further, the piezoelectric body 3 for example includes a base part 11, driving arms 13 (13A to 13D) and detecting arms 15 (15A and 15B) which extend from the base part 11, and a frame part 17 surrounding them.

A pair of driving arms 13 are portions which are excited by application of voltage (electric field). The detecting arms 15 are portions which vibrate due to the Coriolis force and generate electrical signals in accordance with the angular velocity. The base part 11 is a portion contributing to support of the driving arms 13 and detecting arms 15 and transfer of vibrations from the driving arms 13 to the detecting arms 15. The frame part 17 is a portion contributing to support of the base part 11. In the present embodiment, the frame part 17 contributes to mounting of the sensor element 1 on a not shown mounting body as well.

The base part 11 for example extends in the x-axis direction and is arranged bridging the frame part 17. The plurality of driving arms 13 extend alongside each other (for example in parallel to each other) toward the same directions as each other (positive side in the y-axis direction). The front ends of the driving arms 13 are formed as free ends. The number of the driving arms 13 is an even number (four in the present embodiment). The plurality of detecting arms 15 extend alongside each other (for example in parallel to each other) toward the direction (negative side of the y-axis direction) opposite to the direction of extension of the plurality of driving arms 13. The front ends of the detecting arms 15 are formed as free ends. The number of the detecting arms 15 is an even number (two in the present embodiment).

Each of the detecting arms 15 is shaped with one or more (three in the example shown) via grooves (notation is omitted) penetrating through the detecting arm 15 in the z-axis direction and extending in the y-axis direction formed therein. From another viewpoint, the detecting arms 15 have pluralities of (four in the example shown) divided arms 15a extending alongside each other. By the detecting arms 15 having the pluralities of divided arms 15a, for example, as will be understood from the explanation which will be given later, the number of the detecting electrodes 7 arranged can be increased to thereby improve a detection sensitivity.

(Frame Part of Piezoelectric Body)

The frame part 17 is ring-shaped surrounding the base part 11, driving arms 13, and detecting arms 15. The ring shape is for example substantially rectangular. The frame part 17 has a pair of first extending portions 17a which extend in the y-axis direction and face each other in the x-axis direction and a pair of second extending portions 17b which extend in the x-axis direction and connect the end parts of the pair of first extending portions 17a to each other. The base part 11 is made to bridge the pair of first extending portions 17a. Further, for example, the base part 11 is positioned at substantially the centers of the first extending portions 17a in the length direction.

The size of the frame part 17 may be suitably set. For example, the frame part 17 may be made as small as possible while separated from the driving arms 13 and detecting arms 15 with suitable distances so as not to abut against these arms due to vibrations etc. used for detection of the angular velocity. The first extending portion 17a is for example longer than the second extending portion 17b. However, the lengths of the two may be made equal or a relationship of length may be reversed to that in the example shown.

The shapes of the transverse cross-sections of the frame part 17 (each of the first extending portion 17a and second extending portion 17b) are for example substantially rectangular over the entire length of the frame part 17. The thickness (z-axis direction) of the frame part 17 is for example constant over the entire length of the frame part 17.

The width of the frame part 17 for example changes in accordance with the position of the frame part 17. For example, the first extending portion 17a partially becomes narrower in width. In more detail, for example, the first extending portion 17a between the position of connection with the base part 11 and the positions of connection with the second extending portions 17b has narrow width portions 17c which become narrower in widths (x-axis direction) than the other portions in the first extending portion 17a. The narrow width portions 17c are for example configured by formation of concave portions in the outer surfaces of the frame part 17. However, the narrow width portions 17c may be formed by formation of concave portions in the inner surfaces of the frame part 17 as well.

The widths of the parts in the first extending portion 17a other than the narrow width portions 17c may be broader than, equal to, or narrower than the width (y-axis direction) of the second extending portion 17b. In the example shown, the former becomes somewhat broader than the latter.

(Pads)

The pads 9 are for example provided on the surface on the positive side or negative side (negative side in the present embodiment) in the z-axis direction of the frame part 17. The positions of the four pads 9 when viewed on a plane may be suitably set. For example, the four pads 9 are positioned at four corners in the frame part 17. The pads 9 for example face not shown pads provided on a mounting body and are bonded to the pads on the mounting body by bumps made of solder or conductive adhesive. Due to this, electrical connection of the sensor element 1 and the mounting body is achieved. Further, the sensor element 1 (piezoelectric body 3) is supported in a state where the driving arms 13 and detecting arms 15 can vibrate.

(Excitation Electrodes)

FIG. 3A is a cross-sectional view taken along the IIIa-IIIa line in FIG. 2.

The excitation electrodes 5 (notation is attached to the driving arm 13D on the right side on the drawing sheet) are layer-shaped conductors formed on the surfaces of the driving arms 13. Between the excitation electrodes 5A and 5B, the excitation electrode 5A is respectively provided on the upper surface and lower surface (positive side and negative side in the z-axis direction) at each driving arm 13. On the other hand, between the excitation electrodes 5A and 5B, the excitation electrode 5B is respectively provided on the side surfaces (surfaces on the positive side and negative side in the x-axis direction) at each driving arm 13.

The two excitation electrodes 5A and two excitation electrodes 5B are for example provided so as to cover the majorities of the surfaces of the driving arms 13 excluding the broad width portions on the front ends (see FIG. 1 and FIG. 2 as well). However, between the excitation electrode 5A and the excitation electrode 5B, at least either (excitation electrodes 5A in the present embodiment) are formed smaller in the width direction than the surfaces so that they do not short-circuit with each other. Further, parts of the driving arms 13 on the root side and front end side may be made positions where no excitation electrodes 5 are arranged.

At each of the driving arms 7, the two excitation electrodes 5A are for example rendered the same potentials as each other. For example, the two excitation electrodes 5A are connected to each other by the wiring 19 on the piezoelectric body 3. Further, at each of the driving arms 7, the two excitation electrodes 5B are for example rendered the same potentials as each other. For example, the two excitation electrodes 5B are connected to each other by the wiring 19 on the piezoelectric body 3.

In such an arrangement and connection relationships of the excitation electrodes 5, if voltage is supplied between the excitation electrodes 15A and the excitation electrodes 15B, for example, in the driving arms 7, an electric field from the upper surface toward the pair of side surfaces (two sides in the x-axis direction) and an electric field from the lower surface toward the pair of side surfaces are generated. On the other hand, the polarization axis matches with the x-axis direction. Accordingly, when focusing on the components in the x-axis direction of the electric fields, in the driving arm 7, the orientation of the electric field and the orientation of the polarization axis match in one side portion of the x-axis direction, while the orientation of the electric field and the orientation of the polarization axis become inverse to each other in the other side portion.

As a result, the one side portion of the driving arm 13 in the x-axis direction contracts in the y-axis direction, and the other side portion extends in the y-axis direction. Further, the driving arm 13 flexes to the one side in the x-axis direction like a bimetal. If the voltage supplied to the excitation electrodes 5A and 5B is inverted, the driving arm 13 flexes to an inverse direction. When the AC voltage is supplied to the excitation electrodes 5A and 5B, the driving arm 13 vibrates in the x-axis direction.

Although particularly not shown, one or more recessed grooves extending along the long direction of the driving arm 13 (the recessed groove may be configured by a plurality of concave portions arranged in the long direction of the driving arm 13 as well) may be provided in the upper surface and/or lower surface of the driving arm 13, and the excitation electrodes 5A may be provided over the interiors of the recessed grooves. In this case, the excitation electrodes 5A and the excitation electrodes 5B face each other in the x-axis direction while sandwiching the wall portions of the recessed grooves therebetween, therefore the efficiency of excitation is improved.

Between mutually neighboring two driving arms 13 (two of the driving arms 13A and 13B or two of the driving arms 13C and 13D), the excitation electrodes 5A are rendered the same potentials as each other, and the excitation electrodes 5B are rendered the same potentials as each other. The excitation electrodes 5 to be rendered the same potential are for example connected to each other by the wirings 19 on the piezoelectric body 3.

If the AC voltage is supplied between the excitation electrodes 5A and the excitation electrodes 5B in such connection relationships, mutually neighboring two driving arms 13 are supplied with voltages with the same phases as each other, therefore vibrate so as to flexurally deform in the same orientations as each other in the x-axis direction. The mutually neighboring two driving arms 13 may be grasped as corresponding to arms obtained by dividing one driving arm.

As shown in FIG. 1 and FIG. 2, the mutually neighboring two driving arms 13 are integrally formed in their root portions. In other words, when viewed on a plane, the surface between the mutually neighboring two driving arms 13 which faces the front end side (+y side) of these driving arms 13 become higher than the outer sides of these two driving arms 13 (surfaces on the +y side of the base part 11). Due to this, the two driving arms 13 become easy to vibrate together. This structure is not disclosed in Patent Literature 1.

Returning to FIG. 3A, in one pair of driving arms 13 which are line symmetrically arranged (one pair configured by the driving arms 13A and 13D or one pair configured by the driving arms 13B and 13C), the excitation electrodes 5A and the excitation electrodes 5B are rendered the same potential. The excitation electrodes 5 to be rendered the same potentials as each other are connected by for example the wirings 19 on the piezoelectric body 3.

If AC voltage is supplied between the excitation electrodes 5A and the excitation electrodes 5B in such connection relationships, the line symmetrically arranged pair of driving arms 13 are supplied with voltages with inverse phases from each other, so vibrate so as to flexurally deform in inverse orientations to each other (line symmetrically) in the x-axis direction.

(Detecting Electrodes)

FIG. 3B is a cross-sectional view taken along the IIIb-IIIb line in FIG. 2.

The detecting electrodes 7 (notations are attached to the divided arm 15a on the right side on the drawing sheet) are layer-shaped conductors which are formed on the surfaces of the detecting arms 15 (divided arms 15a). The detecting electrodes 7 are provided on each divided arm 15a.

More specifically, in the each of divided arms 15a, the detecting electrodes 7A are respectively provided in the region on the positive side in the z-axis direction (for example, the side more positive than the center of the surface) in the surface facing the negative side in the x-axis direction and in the region on the negative side in the z-axis direction (for example, the side more negative than the center of the surface) in the surface facing the positive side in the x-axis direction. In each of the detecting arms 15, the detecting electrodes 7B are provided in the region on the negative side in the z-axis direction (for example, the side more negative than the center of the surface) in the surface facing the negative side in the x-axis direction and in the region on the positive side in the z-axis direction (for example, the side more positive than the center of the surface) in the surface facing the positive side in the x-axis direction.

At each of the side surfaces of the divided arm 15a, the detecting electrodes 7A and 7B extend along the divided arm 15a so that they are separated by suitable interval so as not to short-circuit with each other. The detecting electrodes 7 extend along substantially the entire length of the divided arm 15a. Two detecting electrodes 7A are for example connected with each other by the wiring 19 on the piezoelectric body 3. Further, two detecting electrodes 7B are connected with each other by for example the wiring 19 on the piezoelectric body 3.

In such an arrangement and connection relationships of the detecting electrodes 7, if the divided arm 15a flexurally deforms in the z-axis direction, for example, electric fields parallel to the z-axis direction are generated. That is, at each of the side surfaces of the divided arm 15a, voltage is generated between the detecting electrode 7A and the detecting electrode 7B. The orientations of the electric fields are determined by the orientation of the polarization axes and the orientation of curvature (positive side or negative side in the z-axis direction) and are inverse to each other between the positive side portion and the negative side portion in the x-axis direction. These voltages (electric fields) are output to the detecting electrodes 7A and detecting electrodes 7B. When the detecting arm 9 vibrates in the z-axis direction, the voltages are detected as AC voltage. Among the electric fields, electric fields parallel to the z-axis direction may be dominant as described above or a ratio of the electric fields which are parallel to the x-axis direction and have inverse orientations to each other between the positive side portions and the negative side portions in the z-axis direction may be larger. In any case, voltages in accordance with the flexural deformation of the divided arm 15a in the z-axis direction are generated between the detecting electrodes 7A and the detecting electrodes 7B.

Between the pluralities of divided arms 15a in each of the detecting arms 15, the detecting electrodes 7A are connected to each other, and the detecting electrodes 7B are connected to each other. The connection is for example achieved by the wirings 19 on the piezoelectric body 3. In such connection relationships, when the plurality of divided arms 15a flexurally deform so as to bend to the same sides as each other in the z-axis direction, the signals detected in the plurality of divided arms 15a are added.

Between the two detecting arms 15, the detecting electrodes 7A and the detecting electrodes 7B are connected. The connection is achieved by the wirings 19 on the piezoelectric body 3. In such connection relationships, when the two detecting arms 15 flexurally deform so as to bend to inverse sides from each other in the z-axis direction, the signals detected in the two detecting arms 15 are added.

(Wirings)

The plurality of wirings 19 connect the excitation electrodes 5 and the detecting electrodes 7 as explained above. Four sets of the electrodes in total are comprised of the excitation electrodes 5 divided into two sets from a viewpoint of potentials and the detecting electrodes 7 divided into two sets from a viewpoint of potentials. The plurality of wirings 19 connect the four sets of the electrodes and the four pads 9 respectively. By suitable arrangement of the plurality of wirings 19 on the upper surfaces, lower surfaces, and/or side surfaces of various parts in the piezoelectric body 3, the connections explained above can be realized without short-circuiting with each other in a mode where the entireties of the wirings 19 are provided on the surfaces of the piezoelectric body 3. However, three-dimensional interconnect portions may be formed as well by providing an insulation layer on the wirings 19 positioned on the piezoelectric body 3 and providing the other wirings 19 above those.

(Driving Circuit and Detecting Circuit)

As shown in FIG. 3A and FIG. 3B, the angular velocity sensor 51 has a driving circuit 103 supplying voltages to the excitation electrodes 5 and a detecting circuit 105 detecting the electrical signals from the detecting electrodes 7.

The driving circuit 103, for example, is configured including an oscillation circuit and amplifier, and supplies an AC voltage having a predetermined frequency between the excitation electrodes 5A and the excitation electrodes 5B. The frequency may be determined in advance in the angular velocity sensor 51 or may be designated from an external apparatus or the like.

The detecting circuit 105, for example, is configured including an amplifier and wave detecting circuit, detects a potential difference between the detecting electrode 7A and the detecting electrode 7B, and outputs an electrical signal in accordance with the detection result to an external apparatus or the like. More specifically, for example, the potential difference described above is detected as the AC voltage, and the detecting circuit 105 outputs a signal in accordance with the amplitude of the detected AC voltage. The angular velocity is specified based on the amplitude. Further, the detecting circuit 105 outputs a signal in accordance with a phase difference between the voltage applied by the driving circuit 103 and the electrical signal which was detected. The orientation of rotation is specified based on the phase difference.

The driving circuit 103 and detecting circuit 105 configure a control circuit 107 as a whole. The control circuit 107 is for example configured by an IC (integrated circuit) chip and is mounted on a mounting body on which the sensor element 1 is mounted and in turn is electrically connected to the plurality of pads 9.

(Explanation of Operation of Sensor Element)

As explained above, the group of the driving arms 13A and 13B and the group of the driving arms 13C and 13D are excited with inverse phases from each other (phases offset by 180°) so as to deform to inverse sides from each other in the excitation direction (x-axis direction).

When the sensor element 1 is rotated around the y-axis in this state, the driving arms 13 receive Coriolis forces in the direction (z-axis direction) perpendicular to the excitation direction (x-axis direction) and to the rotation direction (y-axis direction). Due to this, the driving arms 13 vibrate in the z-axis direction. Further, the group of the driving arms 13A and 13B and the group of the driving arms 13C and 13D are excited with inverse phases from each other, therefore the groups vibrate so as to flex to inverse sides from each other in the z-axis direction.

The driving arms 13 and the detecting arms 15 are connected by the base part 11. Accordingly, vibrations of the driving arms 13 are transferred through the base part 11 to the detecting arms 15, and the detecting arms 15 vibrate as well. Specifically, the detecting arm 15A vibrates so as to bend to the inverse side relative to the driving arms 13A and 13B in the z-axis direction. Further, the detecting arm 15B vibrates so as to bend to the inverse side relative to the driving arms 13C and 13D in the z-axis direction. That is, the detecting arms 15A and 15B vibrate so as to flex to inverse sides from each other in the z-axis direction. Accordingly, as explained in the explanation of the connection relationships of the plurality of detecting electrodes 7, the electrical signals generated in the two detecting arms 15 are added.

As explained above, the sensor element 1 in the present embodiment, when viewed on a plane, has a piezoelectric body 3 which includes a base part 11 and arm parts (driving arms 13 and detecting arms 15) extending from the base part 11, a plurality of excitation electrodes 5 which are positioned on the surfaces of the driving arms 13, and a plurality of detecting electrodes 7 which are positioned on the surfaces of the detecting arms 15. The piezoelectric body 3, when viewed on a plane, further includes a frame part 17 which surrounds the base part 11, driving arms 13, and detecting arms 15 and which the base part 11 is made to bridge.

Accordingly, for example, compared with the case where there is no second extending portion 17b (case where a pair of arm-shaped mounting parts are provided in place of the frame part 17), vibration of the first extending portion 17a is reduced. Further, for example, the influence of the hardness of a bonding material bonding the pads 9 and a not shown mounting body exerted upon the frequency of vibration of the first extending portion 17a is reduced. As a result, the detection accuracy can be improved.

Further, in the present embodiment, the frame part 17 includes the pair of first extending portions 17a which face each other in the x-axis direction and which the base part bridges. Each of the pair of first extending portions 17a becomes narrow in width in part in the x-axis direction (narrow width portions 17c).

Accordingly, for example, vibrations of the driving arms 13 (or detecting arms 15) or the frame part 17 are absorbed in the narrow width portions 17c. As a result, for example, a possibility of occurrence of unwanted vibration in the driving arms 13 and/or detecting arms 15 by coupling of the vibrations of the arms and the frame part 17 is reduced. In turn, the detection accuracy is improved. Further, for example, shock from the outside is absorbed in the narrow width portions 17c, therefore the base part 11, driving arms 13, and detecting arms 15 are protected from the shock.

Second Embodiment

Figure 4:
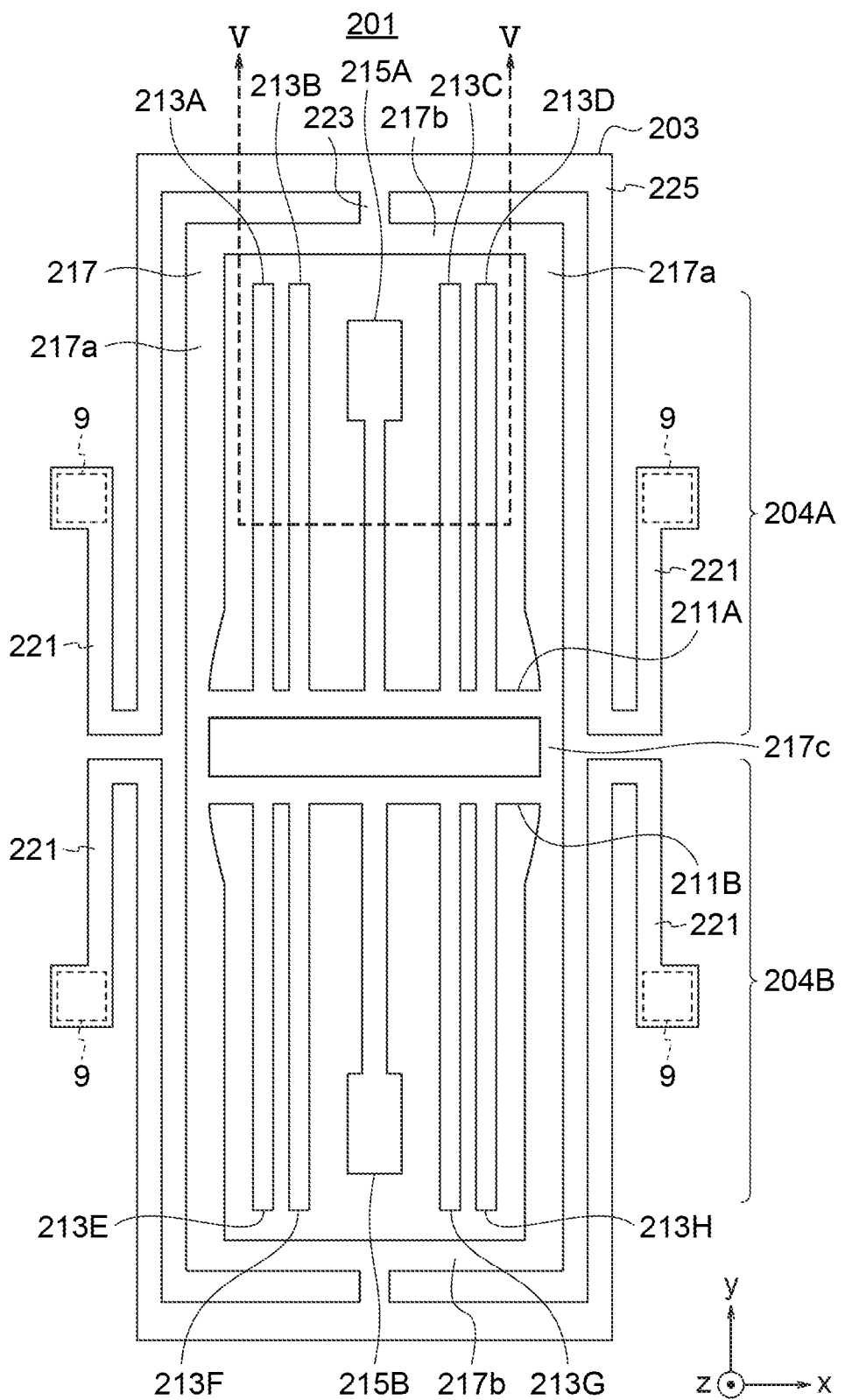
FIG. 4 is a plan view showing the configuration of a principal part of a sensor element according to a second embodiment.

FIG. 4 is a plan view showing the configuration of a principal part of a sensor element 201 according to a second embodiment. However, in this view, illustration of the conductive layers which are provided on the surface of the sensor element 201 is basically omitted.

The sensor element 201, in the same way as the sensor element 1 in the first embodiment, is configured provided with excitation electrodes 5 and detecting electrodes 7 in the arm parts of a piezoelectric body 203. Further, the piezoelectric body 203 has a frame part 217 which the base part 211 bridges. Accordingly, for example, the same effects as those by the first embodiment are exhibited However, the sensor element 201 greatly differs from the sensor element 1 in two points. First, the sensor element 201 differs from the sensor element 1 in the mode of vibration of the piezoelectric body and in the rotation axis around which the angular velocity is detected. Second, the sensor element 201 differs from the sensor element 1 in a mounting mode with respect to a not shown mounting body. In the following description, first, the first point of difference will be explained, then the second point of difference will be explained.

(Configuration According to New Mode of Vibration)

The sensor element 201 for example configures a piezoelectric vibration type angular velocity sensor 251 (notation is shown in FIG. 5) which detects the angular velocity around the x-axis. In the sensor element 201 as well, in the same way as the first embodiment, the piezoelectric body 203 is excited and the electrical signal (for example, voltage or electric charge) due to the Coriolis force is detected, whereby the angular velocity is detected. However, the sensor element 201 is configured so as to realize a new mode of vibration which has not been seen hitherto. Specifically, this is as follows.

(Shape of Piezoelectric Body)

The material for the piezoelectric body 203 and the direction of the polarization axis (relative relationships between the polarization axis and the orthogonal coordinate system xyz) may be the same as those in the piezoelectric body 3 in the first embodiment. Further, the piezoelectric body 203 may be made constant in thickness (z-axis direction) as a whole (including leg portions 221 which will be explained later) in the same way as the piezoelectric body 3.

The piezoelectric body 203 is for example formed in a line symmetrical shape relative to a not shown symmetrical axis parallel to the y-axis. Further, the piezoelectric body 203 is for example formed in a line symmetrical shape relative to a not shown symmetrical axis parallel to the x-axis.

The piezoelectric body 203 has two units 204 (204A and 204B) in a frame part 217. The two units 204 are arranged line symmetrically sandwiching a not shown symmetrical axis parallel to the x-axis therebetween. Each unit 204 for example has a base part 211 (211A or 211B) and at least one pair of (two pairs in the example shown) driving arms 213 (213A to 213H) and a detecting arm 215 (215A or 215B) which extend from the base part 211.

A single unit 204 is enough to realize the method for detecting the angular velocity according to the new mode of vibration according to the present embodiment. In the example shown, the piezoelectric body 203 has two units 204. Therefore, for example, it becomes possible to add the signals of the two units 204 to thereby improve the detection sensitivity.

The base part 211 bridges the frame part 217 (a pair of first extending portions 217a) in the same way as the first embodiment. The base part 211 for example linearly extends parallel to the x-axis. The shape of the transverse cross-section of the base part 211 is for example substantially constant over the entire length and substantially rectangular. Either of the width (y-axis direction) or thickness (z-axis direction) of the base part 211 may be larger than the other as well.

The various dimensions of the base part 211 may be suitably set. The base part 211, as will be explained later, is designed to flexurally deform when viewed on a plane. Accordingly, the width of the base part 211 may be made relatively small. For example, the width of the base part 211 may be made not more than the width of the frame part 217 (the maximum width or minimum width). Further, for example, the width of the base part 211 may be made 2 times or less or 1 time or less of the thickness of the base part 211. Further, for example, the length and width of the base part 211 may be adjusted so that the natural frequency of the flexural deformation when viewed on a plane becomes closer to the natural frequency of the driving arms 213 in a direction in which they are excited by application of voltage and/or the natural frequency of the driving arms 215 in a direction in which they vibrate due to the Coriolis forces.

Although particularly not shown, when viewed on a plane, the two ends of the base part 211 (the portions on the outer sides from the positions where the driving arms 213 are arranged) may be formed in L-shapes, Ω-shapes or S-shapes as well. That is, the base part 211 may include portions intersecting the x-axis at the two ends. By configuring it in this way, the base parts 211 can be formed long to make the base parts 211 easily flex.

The driving arms 213 extend from the base parts 211 in the y-axis direction. The front ends of the driving arms 213 are formed as free ends. In each unit 204, an even number of the driving arms 213 are provided so as to form pairs. In other words, the piezoelectric body 203 includes (at least) one pair of driving arms 213 which extend alongside each other (for example in parallel to each other) at positions separated from each other in the x-axis direction. The pair of driving arms 213 are for example line symmetrically provided relative to a not shown symmetrical axis which passes through the center of the base part 211 and is parallel to the y-axis.

As will be explained later (FIG. 6A and FIG. 6B), the pair of driving arms 213 are intended to make the base part 211 flexurally deform (vibrate) when viewed on a plane due to the excitation in the x-axis direction. Accordingly, for example, the positions of the pair of driving arms 213 in the x-axis direction relative to the base part 211 may be suitably set so that the flexural deformation of the base part 211 becomes large due to vibrations of the pair of driving arms 213. For example, when equally dividing the length in the x-axis direction of the base part 211 into three, the pair of driving arms 213 are respectively positioned in the regions on the two sides.

Specific shapes etc. of the driving arms 213 may be suitably set. For example, the driving arms 213 are substantially long rectangular cuboid shaped. The explanation of the first embodiment stated that recessed grooves could be formed in the upper surfaces and/or lower surfaces of the driving arms 13. For the driving arms 213 as well, in the same way, recessed grooves may be provided as well. Further, the driving arms 213 may be hammer shaped with widths (x-axis direction) becoming broader in the front end side portions as well (see the driving arms 13 in the first embodiment). The paired two driving arms 213 are for example substantially mutually line symmetrically shaped and sized. Accordingly, the vibration characteristics of the two are equal to each other.

The driving arms 213 are excited in the x-axis direction as will be explained later. Accordingly, in the driving arms 213, the larger the width (x-axis direction), the higher the natural frequency in the excitation direction (x-axis direction). Further, the larger the length (mass from another viewpoint), the lower the natural frequency in the excitation direction. The various dimensions of the driving arms 213 are for example set so that the natural frequency in the excitation direction of the driving arms 213 becomes close to the frequency at which excitation is desired be caused.

The detecting arm 215 extends from the base part 211 in the y-axis direction. The front end of the detecting arm 215 is formed as free end. Further, the detecting arm 215 extends between the paired driving arms 213 alongside (for example in parallel) relative to the driving arms 213. The detecting arms 215 are for example positioned at the center in the x-axis direction of the base part 211 and/or positioned at the centers between the paired driving arms 213.

Specific shapes etc. of the detecting arms 215 may be suitably set. For example, the detecting arms 215 are hammer shaped with widths (x-axis direction) becoming broader in the front end side portions. However, the detecting arms 215 may be made substantially constant in shapes of the transverse cross-sections over the entire lengths. Further, in the present embodiment, the detecting arms 215 do not have the divided arms 15a in the first embodiment. However, the divided arms 15a may be provided as well. Further, although not particularly shown, the detecting arm 215 may be configured having a first portion which extends from the base part 211 in the y-axis and a second portion which is connected to the front end and to lateral side of the first portion and extends toward the base part 211 side and whose front end is formed as free end as well (may include a folded back shape as well).

The detecting arms 215, as will be explained later, in the present embodiment, vibrate in the z-axis direction due to the Coriolis force. Accordingly, in the detecting arms 215, the larger the thickness (z-axis direction), the higher the natural frequency in the vibration direction (z-axis direction). Further, the larger the length (mass from another viewpoint), the lower the natural frequency in the vibration direction. The various dimensions of the detecting arms 215 are for example set so that the natural frequency of the detecting arms 215 in the vibration direction becomes close to the natural frequency of the driving arms 213 in the excitation direction. The length of the detecting arm 215 is for example equal to the length of the driving arm 213. However, the two may be different as well.

(Excitation Electrodes, Detecting Electrodes, and Wirings)

FIG. 5 is a cross-sectional view taken along the V-V line in FIG. 4. In this view, the cross-sectional view of the unit 204A is shown. The same is true for the cross-sectional view of the unit 204B.

The configurations and arrangement of the excitation electrodes 5 in each of the driving arms 213 are the same as those in the first embodiment. Accordingly, by application of AC voltage to the excitation electrodes 5A and 5B, the driving arms 213 vibrate in the x-axis direction. Between the units 204A and 204B, the directions of extension of the driving arms 213 are inverse sides from each other. However, in any case, the additional notations "A" of the excitation electrodes 5 correspond to the upper surfaces or lower surfaces of the driving arms 213, and the additional notations "B" of the excitation electrodes 5 correspond to the side surfaces of the driving arms 213.

The configurations and arrangement of the detecting electrodes 7 at each of the detecting arms 215 are the same as those in the first embodiment except that the detecting electrode 7 is not provided for each divided arm 15a. Accordingly, the signals generated due to the vibration in the z-axis direction of the detecting arms 215 are detected by the detecting electrodes 7A and 7B. Between the units 204A and 204B, the directions of extension of the detecting arms 215 are inverse sides from each other. However, in any case, the additional notations "A" of the detecting electrodes 7 correspond to the regions of +z in the side surfaces of −x and the regions of −z in the side surfaces of +x, while the additional notations "B" of the detecting electrodes 7 correspond to the regions of −z in the side surfaces of −x and the regions of +z in the side surfaces of +x.

In each of the units 204, the potentials (connection relationships from another viewpoint) of the plurality of excitation electrodes 5 in the two pairs of driving arms 213 are the same as those in the first embodiment as well. Accordingly, the two pairs of driving arms 213 in each of the units 204 are excited in the same way as the first embodiment.

Concerning the two units 204, among the driving arms 213 which are positioned on the same side of the x-axis direction relative to the detecting arms 215 (among 213A, 213B, 213E, and 213F, or among 213C, 213D, 213G, and 213H), the excitation electrodes 5A are mutually rendered the same potentials and the excitation electrodes 5B are mutually rendered the same potentials. The excitation electrodes 5 to be rendered the same potential are for example connected to each other by the plurality of wirings 19 on the piezoelectric body 203. Accordingly, between the two units 204, the plurality of driving arms 213 mutually become closer or are separated relative to the detecting arm 215 side with the same phases as each other.

Further, between the detecting arms 215 in the two units 204, the detecting electrodes 7A and the detecting electrodes 7B are rendered the same potential. The detecting electrodes 7 to be rendered the same potential are for example connected to each other by the plurality of wirings 19 on the piezoelectric body 203. Accordingly, when the two detecting arms 215 flex to inverse sides from each other in the z-axis direction, the signals generated in the two are added.

As described above, the four sets of electrode groups in total are comprised of the excitation electrodes 5 divided into the two sets from the viewpoint of the potentials and the detecting electrodes 7 divided into two sets from the viewpoint of potentials. The four sets of electrode groups are connected with the four pads 9 by the plurality of wirings 19 on the piezoelectric body 203.

(Operation of Angular Velocity Sensor)

Figure 6A:
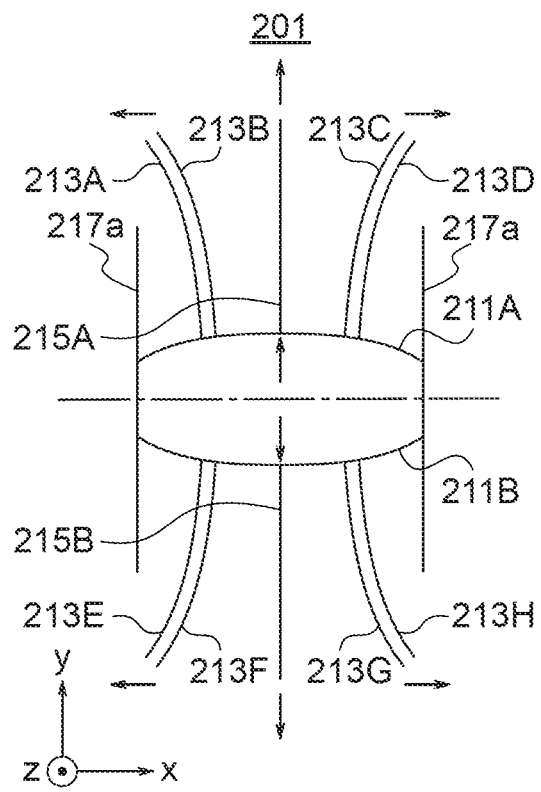
FIG. 6A, FIG. 6B, FIG. 6C, and FIG. 6D are schematic views for explaining the action of the sensor element in FIG. 4.
Figure 6B:
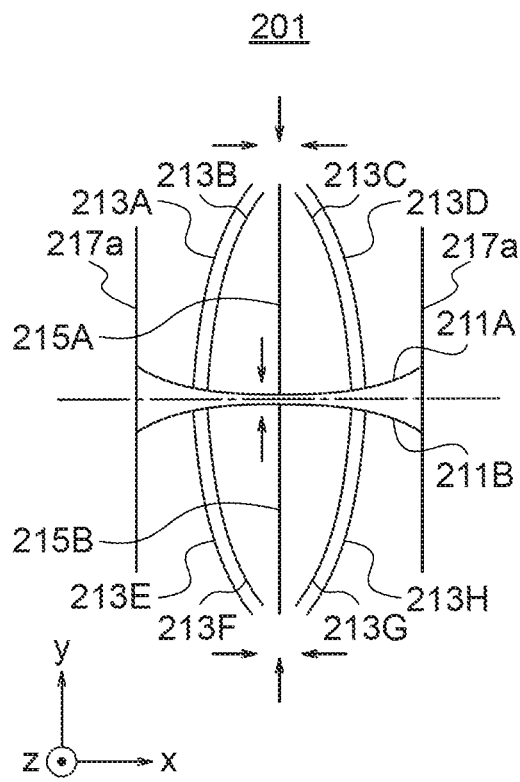

FIG. 6A and FIG. 6B are schematic plan views for explaining excitation of the piezoelectric body 203. In the two views, phases of the AC voltages supplied to the excitation electrodes 5 are offset by 180° from each other. In these views, for the frame part 217 and its outer side portions, only a part of the first extending portion 217a is shown.

As explained above, in each of the units 204, at least one pair of (two pairs in the present embodiment) driving arms 213 are excited with inverse phases from each other so as to deform in inverse orientations to each other in the x-axis direction due to application of AC voltage to the excitation electrodes 5.

At this time, as shown in FIG. 6A, if the paired driving arms 213 flex to outer sides in the x-axis (sides where the paired driving arms 213 are separated from each other) relative to each other, the bending moments are transferred to the base part 211, and the base part 211 flexes to the outer side of the y-axis direction (+y side in 204A and −y side in 204B). As a result, the detecting arm 215 is displaced to the outer side in the y-axis direction.

Conversely, as shown in FIG. 6B, when the paired driving arms 213 flex to the inner sides in the x-axis direction (sides where the paired driving arms 213 become closer to each other), the bending moments thereof are transferred to the base part 211, and the base part 211 is displaced to the inner side in the y-axis direction. As a result, the detecting arm 215 is displaced to inner side in the y-axis direction.

Accordingly, by excitation of the paired driving arms 213, the detecting arm 215 ends up vibrating in the y-axis direction. Further, between the two units 204, the plurality of driving arms 213 are vibrated with the same phases as each other, therefore the two detecting arms 215 vibrate so as to be displaced to inverse sides from each other in the y-axis direction.

Figure 6C:
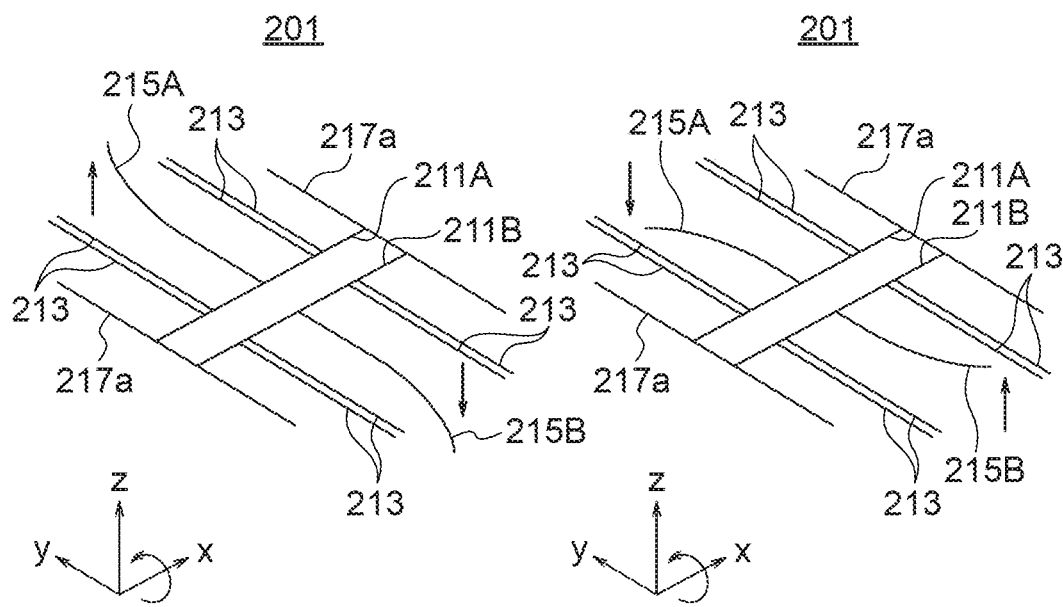
Figure 6D:
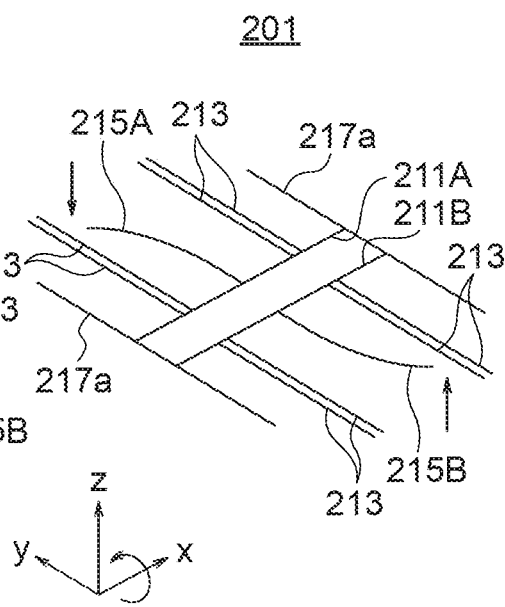

FIG. 6C and FIG. 6D are schematic perspective views for explaining vibrations of the detecting arms 215 due to the Coriolis forces. FIG. 6C and FIG. 6D correspond to the states in FIG. 6A and FIG. 6B. In these views, illustration of deformations of the driving arms 213 and base parts 211 is omitted.

When the sensor element 201 is rotated around the x-axis in a state where the piezoelectric body 3 is vibrating as in FIG. 6A and FIG. 6B, the detecting arms 215 are vibrating (displaced) in the y-axis direction, therefore vibrate (deform) in the direction (z-axis direction) perpendicular to the rotation axis (x-axis) and to the vibration direction (y-axis) due to the Coriolis forces. The signals (for example voltages) generated due to these deformations are extracted by the detecting electrodes 7 as explained above. The larger the angular velocity, the larger the Coriolis force (in turn the voltage of the signal detected). Due to this, the angular velocity is detected.

Further, the two detecting arms 215 are vibrating with phases of displacement to inverse sides from each other in the y-axis direction. Therefore, they receive the Coriolis forces on the same side relative to the rotation direction around the x-axis. From another viewpoint, the two detecting arms 215 vibrate so as to bend to inverse sides from each other in the z-axis direction. Further, as explained above, between the two detecting arms 215, the detecting electrodes 7A and the detecting electrodes 7B are connected, therefore the signals generated in the two detecting arms 215 are added.

As described above, in the present embodiment, the base part 211 is arranged bridging the frame part 217 in the x-axis direction in the orthogonal coordinate system xyz. The arm parts extending from the base part 211 includes (at least) one pair of driving arms 213 which extend alongside each other in the y-axis direction at positions separated from each other in the x-axis direction and the detecting arm 215 which extends in the y-axis direction at the position which becomes the center between the pair of driving arms 213 in the x-axis direction. The plurality of excitation electrodes 5 are provided in an arrangement enabling application of voltage exciting the pair of driving arms 213 in the x-axis direction. The plurality of detecting electrodes 7 are provided in an arrangement enabling detection of the signal generated due to vibration in the z-axis direction of the detecting arm 215. The plurality of wirings 19 connect the plurality of excitation electrodes 5 so that voltages having phases inverse from each other are supplied from the plurality of excitation electrodes 5 to the pair of driving arms 213 so that the pair of driving arms 213 vibrate bending to inverse sides from each other in the x-axis direction.

Accordingly, detection by a new mode of vibration of using excitation of the pair of driving arms 213 to make the base part 211 flex (vibrate) and make the detecting arm 215 displace (vibrate) and using the Coriolis force acting upon the displaced detecting arm 215 to detect the angular velocity becomes possible.

In the first embodiment, the Coriolis force was made act upon the excited driving arms 13 to make them vibrate, and the vibrations due to this Coriolis force were transferred to the detecting arms 15. In the present embodiment, compared with the first embodiment, the Coriolis force directly acts upon the detecting arm 215. As a result, for example the detection sensitivity is improved.

Further, as a comparative example, for example, there can be mentioned a mode where the detecting arm is bent to deform (vibrate) in the same direction as the vibration direction (x-axis direction) of the driving arm, and the Coriolis force is made act upon the vibrating detecting arm. In the present embodiment, the vibration direction of the detecting arm is different from such a mode, and it becomes possible to detect the angular velocity for the rotation axis (x-axis) for which the angular velocity could not be detected in the comparative example explained before.

The base part 211 in the present embodiment is for example designed so that the detecting arm 215 is easily displaced by flexural deformation of the base part 211, therefore there is a high probability that the base part 211 is made a configuration where vibration easily occurs over its entire length. As a result, for example, the detection accuracy of the angular velocity in the sensor element 1 is easily influenced by the stiffness of the portion (frame part 217) supporting the base part 211. On the other hand, as explained in the explanation of the first embodiment, by employing the frame part 217 as the configuration supporting the base part 211, for example, unwanted vibration occurring in the frame part 217 is suppressed or an influence of unevenness of bonding of the pads 9 to the mounting body exerted upon the vibration of the first extending portion 217a is reduced. Accordingly, for example, the effect of improvement of the detection accuracy by the frame part 217 is effectively exhibited.

In the first embodiment or comparative example explained above, in a case where provision is made of a pair of driving arms driven with inverse phases so as to bend to inverse sides from each other in the x-axis direction, the detecting arm is not positioned at the center of the pair of driving arms. This is because, when configured in this way, vibrations of the pair of driving arms (ones due to excitation or ones due to the Coriolis force) are balanced with each other at the position of the detecting arm, therefore the principle of making the detecting arm vibrate in the vibration direction of the driving arms does not stand.

There is a prior art in which a detecting arm is positioned at the center of a pair of driving arms driven with inverse phases so as to bend to inverse sides from each other. However, in such a prior art, the driving arms are arranged at the two ends of the base part. Further, the two ends of the base part become able to vibrate. That is, the base part does not bridge the frame part.

(Mounting Structure)

Returning to FIG. 4, the mounting structure will be explained as another point of difference from the first embodiment.

In the first embodiment, the pads 9 were provided in the frame part 17, and the frame part 17 acted as the portion to be bonded to a not shown mounting body. Contrary to this, in the present embodiment, the pads 9 are not provided in the frame part 217, and the frame part 217 does not act as the portion to be bonded to the mounting body. Specifically, this is as follows.

The piezoelectric body 203 has a plurality of (four in the example shown) leg portions 221 which extend from the frame part 217 to outer sides of the frame part 217 when viewed on a plane. Further, the pads 9 are provided at the front ends of the leg portions 221. Accordingly, the frame part 217 ends up being elastically supported by the leg portions 221.

The positions of connection of the leg portions 221 with respect to the frame part 217, the shapes of the leg portions 221, the positions of the front ends of the leg portions 221 relative to the frame part 217, various dimensions of the leg portions 221, and the like may be suitably set. In the example shown, they are set as follows.

Each two among the four leg portions 221 for example extend outward from the center position of each of a pair of second extending portions 217b. The two leg portions 221 which extend outward from each second extending portion 217b are shared at the portion where they extend outward from the second extending portion 217b. However, such sharing need not be carried out either.

The two leg portions 221 extending outward from each second extending portion 217b for example extend in inverse directions to each other along the periphery of the frame part 217. Specifically, for example, each leg portion 221 extends along about a half of the second extending portion 217b, and then extends along about a half of the first extending portion 217a. In this way, the leg portion 221 includes a portion which extends along at least a portion of the periphery of the frame part 217.

Each leg portion 221 for example extends along the periphery of the frame part 217 as described above and then is folded back (changes in direction by 180°) and extends. Specifically, for example, the leg portion 221 extends along the first extending portion 217a to reach the vicinity of the center of the first extending portion 217a and then is offset in position to the further outer side relative to the frame part 217 and extends in an inverse direction to that up to then along the first extending portion 217a.

The front end of each leg portion 221 is for example positioned on the lateral side of the first extending portion 217a and at a position separated from the center of the first extending portion 217a to the outer side. Accordingly, the front ends of the four leg portions 221 are arranged so as to configure the vertices of a rectangle. In the example shown, the front ends of the leg portions 221 are positioned on inner sides from the end parts in the y-axis direction of the piezoelectric body 203 (in the example shown, portions extending along the second extending portions 217b in the leg portions 221). However, the front ends of the leg portions 221 may be positioned at the end parts in the y-axis direction of the piezoelectric body 203 as well.

The widths of the leg portions 221 may be constant or may change in accordance with the positions in the length direction. Further, the widths of the leg portions 221 may be larger than, equal to, or smaller than the width of the frame part 217 (maximum width or minimum width). In the example shown, the widths of at least part of the leg portions 221 are smaller than the maximum width of the frame part 217 and not more than the minimum width of the frame part 217. Further, the front ends of the leg portions 221 are for example made broader in widths compared with the other parts.

The plurality of leg portions 221 may be grasped as configured by projection portions 223 which project from the frame part 217 to outer sides of the frame part 217 (in the example shown, shared portions at the roots of two leg portions 221) and a mounting part 225 which is connected with the projection portions 223 and is provided with the pads 9. Further, the mounting part 225 may be grasped as including a plurality of leg portions (however, the portions of the leg portions 221 excluding the projection portions 223).

The shape of the frame part 217 is substantially the same as the shape of the frame part 17 in the first embodiment. However, the frame part 217 may differ from the first embodiment in the positions in the length directions of the sides (first extending portions 217a and second extending portions 217b) at which the width changes. In the example shown, the first extending portions 217a have the narrow width portions 217c which become narrower in widths (x-axis direction) than the other portions in the first extending portions 217a, the narrow width portions 217c are located at the connection positions of the first extending portions 217a and the base part 211. The narrow width portions 217c are for example configured by formation of concave portions in the inner surfaces of the frame part 217. Due to this, compared with a case where the narrow width portions 217c are configured by formation of concave portions in the outer surfaces of the frame part 217 (may also be configured in this way), the base part 211 becomes longer. In the same way as the first embodiment, the widths of the portions other than the narrow width portions 217c in the first extending portions 217a may be broader than, equal to, or narrower than the widths (y-axis direction) of the second extending portions 217b.

As described above, in the present embodiment, the piezoelectric body 203 has a plurality of leg portions 221 which extend from the frame part 217 to the outer sides of the frame part 217 when viewed on a plane and are provided with pluralities of pads 9.

Accordingly, compared with the case where the pads 9 are provided in the frame part 217, the frame part 217 is elastically supported by the plurality of leg portions 221. As a result, for example, even if there is a difference of thermal expansion between the sensor element 1 and the mounting body on which the sensor element 1 is mounted, the difference of thermal expansion is absorbed by deformations of the leg portions 221, therefore thermal stress which is transferred from the mounting body to the frame part 217 is mitigated. In turn, the possibility of change of the characteristics of the sensor element 1 due to a temperature change is reduced.

Further, in the present embodiment, at least one (all in the present embodiment) of the plurality of leg portions 221 includes a portion which extends along at least a portion of the periphery of the frame part 217 between the frame part 217 and the pad 9. Further, at least one (all in the present embodiment) of the plurality of leg portions 221 includes a portion extending while being folded back between the frame part 217 and the pad 9.

Accordingly, it is possible to promote a reduction of size of the sensor element 1 while securing the lengths of the leg portions 221 and thereby enhancing the effect of easing the thermal stress.

In the present embodiment, each of the plurality of leg portions 221 has one pad 9. However, a plurality of pads 9 may be provided in one leg portion 221 as well. Further, in the present embodiment, the plurality of pads 9 provided at the plurality of leg portions 221 are all connected to the electrodes (5 or 7). However, dummy pads which are not connected to any electrode and are aimed at only bonding of the leg portions 221 may be provided as well.

Third Embodiment (Configuration of Angular Velocity Sensor)

FIG. 7 is a cross-sectional view showing the configuration of a principal part of a sensor element 301 in an angular velocity sensor 351 according to a third embodiment.

The angular velocity sensor 351 is substantially configured the same as the angular velocity sensor 251 according to the second embodiment. However, in contrast to the angular velocity sensor 251 being one detecting rotation around the x-axis, the angular velocity sensor 351 is made one detecting rotation around the z-axis. Specifically, this is as follows.

The sensor element 301 has a piezoelectric body 203, a plurality of excitation electrodes 5, a plurality of detecting electrodes 307 (307A and 307B), a plurality of pads 9 (not shown here), and a plurality of wirings 19. As will be understood from these notations, except for the plurality of detecting electrodes 307 (and wirings 19 concerned with them), the fundamental configuration of the sensor element 301 may be made substantially the same as that of the sensor element 201 in the second embodiment.

Accordingly, FIG. 4 may be grasped as a plan view showing the piezoelectric body 203 and pads 9 in the sensor element 301. Further, FIG. 7 corresponds to the V-V line in FIG. 4.

However, in the present embodiment, the detecting arms 215, unlike the second embodiment, are intended to vibrate in the x-axis direction due to the Coriolis force. Based on such a difference, the specific dimensions may be different from those in the second embodiment.

For example, in the detecting arms 215, the larger the width (x-axis direction), the higher the natural frequency in the vibration direction (x-axis direction). Further, the larger the length (mass from another viewpoint), the lower the natural frequency in the vibration direction. The various dimensions of the detecting arms 215 are for example set so that the natural frequency of the detecting arms 215 in the vibration direction becomes closer to the natural frequency of the driving arms 213 in the excitation direction.

The detecting electrodes 307A and 307B are ones extracting the signals generated due to bending deformation in the x-axis direction of the detecting arms 215. Therefore, for example, they are configured the same as the excitation electrodes 5A and 5B for exciting the driving arms 213 in the x-axis direction. Accordingly, the explanation for the excitation electrodes 5 in the first or second embodiment may be made the explanation for the detecting electrodes 307 by replacing the terms "excitation electrodes 5" with the "detecting electrodes 307". The same is true for mutual connection of the pair of detecting electrodes 307A and mutual connection of the pair of detecting electrodes 307B in each detecting arm 215.

Between the two detecting arms 215, the detecting electrodes 307A and the detecting electrodes 307B are connected. Accordingly, signals generated in the detecting arms 215 when the two detecting arms 215 bend to inverse sides from each other in the x-axis direction are added. The connection of the detecting electrodes 307 is for example achieved by the plurality of wirings 19 on the piezoelectric body 203.

In the second embodiment, the fact that slits penetrating through the upper surfaces and lower surfaces (plurality of divided arms 15a from another viewpoint) could be provided in the detecting arms 215 was alluded to. In the third embodiment, in the detecting arms 215, in the same way as the driving arms 213, recessed grooves may be provided in their upper surfaces and/or lower surfaces.

(Operation of Angular Velocity Sensor)

Excitation of the piezoelectric body 203 in the third embodiment is the same as that in the second embodiment. FIG. 6A and FIG. 6B may be grasped as views showing the excitation states of the piezoelectric body 203 in the third embodiment. Accordingly, the driving arms 213 forming the pair of arms sandwiching the detecting arm 215 therebetween vibrate so as to approach or separate in the x-axis direction relative to each other. The detecting arm 215 are displaced (vibrate) in the y-axis direction due to the flexural deformation of the base parts 211.

Figure 8A:
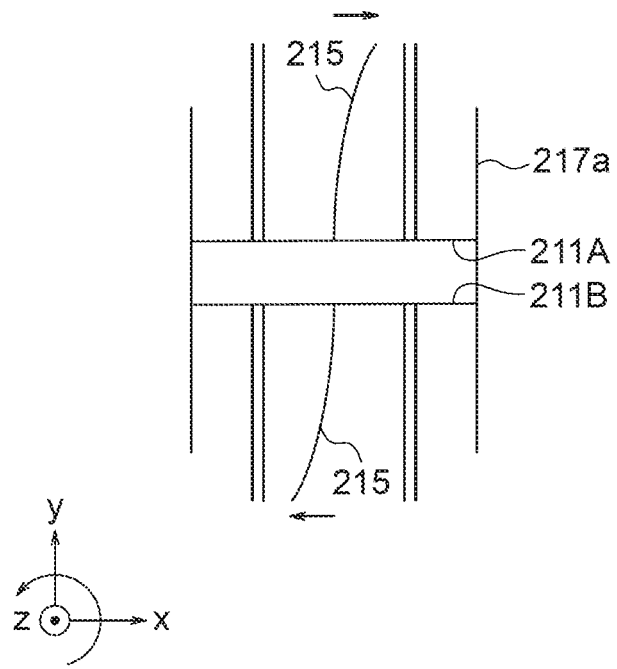
FIG. 8A and FIG. 8B are schematic views for explaining an action of the sensor element in FIG. 7.
Figure 8B:
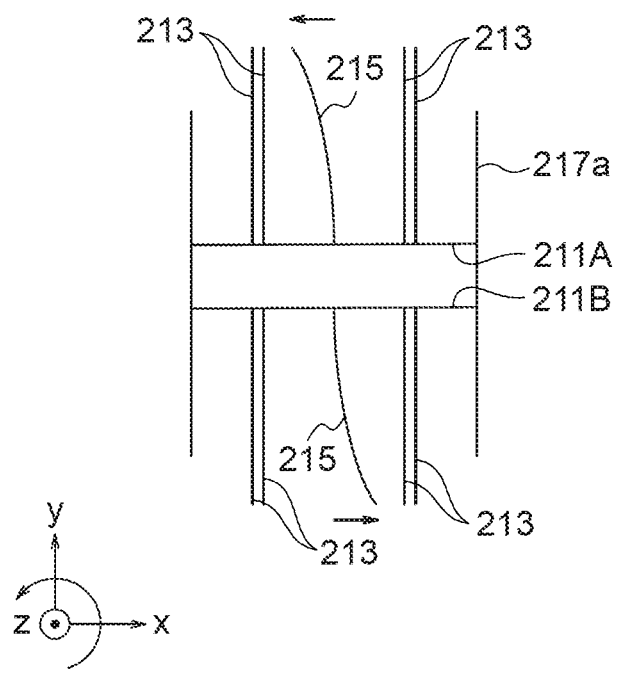

FIG. 8A and FIG. 8B are schematic plan views for explaining vibrations of the detecting arms 215 due to Coriolis forces. FIG. 8A and FIG. 8B correspond to the states in FIG. 6A and FIG. 6B.

When the sensor element 1 is rotated around the z-axis in a state where the piezoelectric body 203 is vibrating as in FIG. 6A and FIG. 6B, the detecting arms 215 are vibrating (displaced) in the y-axis direction, therefore vibrate (displaced) in the direction (x-axis direction) perpendicular to the rotation axis (z-axis) and to the vibration direction (y-axis) due to the Coriolis forces. The signals (for example voltages) generated due to these deformations are extracted by the detecting electrodes 307 and are input to the detecting circuit 105. The larger the angular velocity, the larger the Coriolis forces (in turn the voltages of the signals detected). Due to this, the angular velocity is detected.

Further, the two detecting arms 215 are vibrating with phases of displacement to inverse sides from each other in the y-axis direction, therefore receive the Coriolis forces on the same side relative to the rotation direction around the z-axis. From another viewpoint, the two detecting arms 215 vibrate so as to bend to inverse sides from each other in the x-axis direction. Further, between the two detecting arms 215, the detecting electrode 307A and the detecting electrode 307B are connected, therefore the signals generated in the two detecting arms 215 are added.

As described above, in the present embodiment as well, in the same way as the second embodiment, the piezoelectric body 203 includes a base part 211 arranged bridging the frame part 217, (at least) one pair of driving arms 213 extending alongside each other from the base part 211, and detecting arm 215 which is positioned at the center of the pair of driving arms 213. The plurality of excitation electrodes 5 and plurality of wirings 19 are provided so that they can make the pair of driving arms 213 vibrate with inverse phases from each other. Further, the plurality of detecting electrodes 307 are provided in an arrangement enabling detection of the signal generated due to bending deformation in the x-axis direction of the detecting arm 215.

Accordingly, the same effects as those by the second embodiment are exhibited. For example, detection according to a new mode of vibration making the detecting arm 215 displaced in the y-axis direction due to flexing of the base part 211 becomes possible. As a result, for example, the Coriolis forces directly act upon the detecting arm 215, therefore improvement of the detection sensitivity can be expected. Further, for example, it becomes possible to detect the angular velocity for an axis (z-axis) for which the angular velocity could not be detected in the comparative example in which the detecting arm was bent to deform (vibrate) in the same direction as the vibration direction (x-axis direction) of the driving arms and the Coriolis force was made act upon this vibrating detecting arm.

Fourth Embodiment

Figure 9:
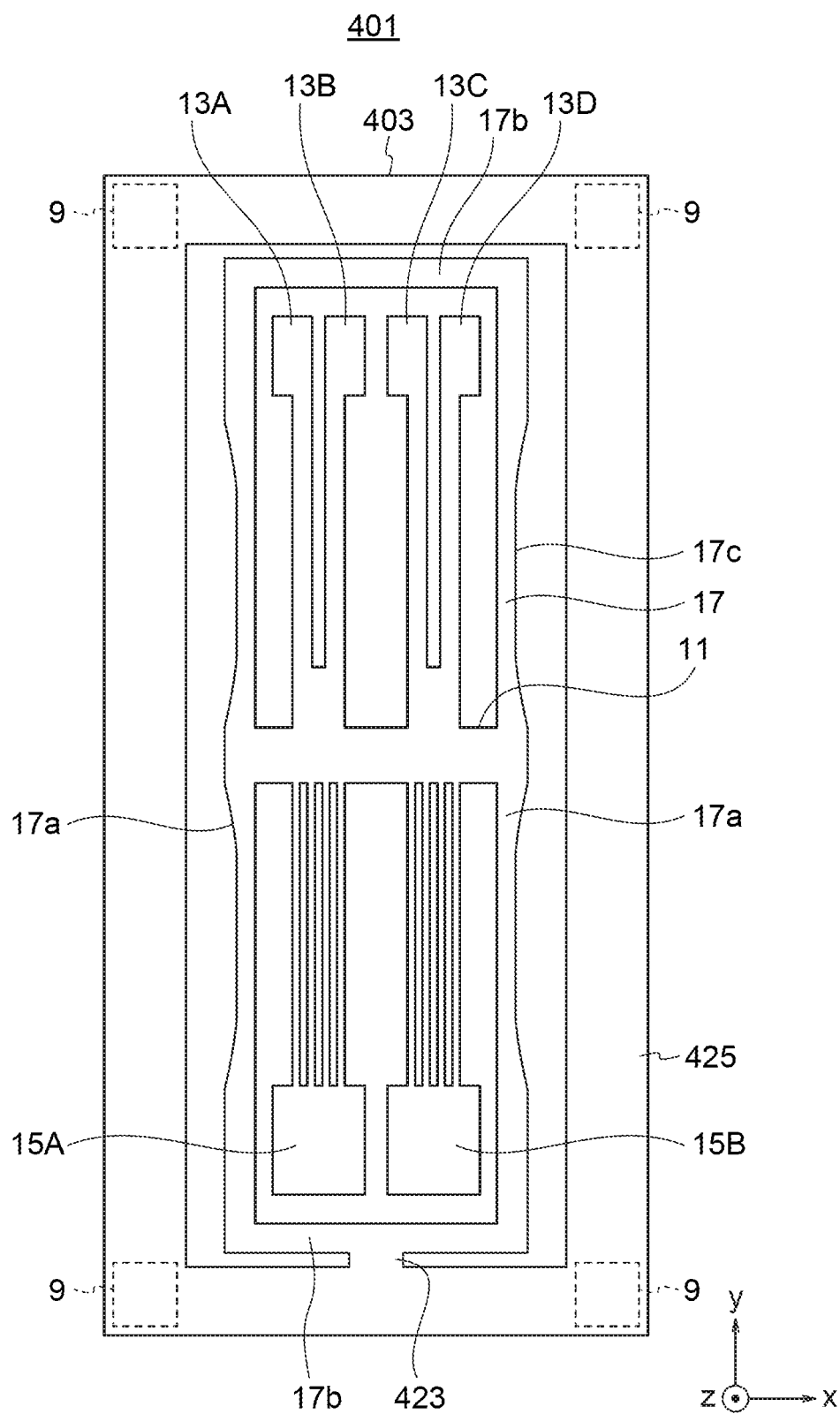
FIG. 9 is a plan view showing the configuration of a principal part of a sensor element according to a fourth embodiment.

FIG. 9 is a plan view showing the configuration of a principal part of a sensor element 401 according to a fourth embodiment.

The sensor element 401 is for example one detecting the angular velocity around the y-axis according to the same principle as that of the sensor element 1 in the first embodiment. Specifically, a piezoelectric body 403 in the sensor element 401 includes the piezoelectric body 3 in the sensor element 1 (base part 11, driving arms 13, detecting arms 15, and frame part 17). Further, although not shown here, the sensor element 401 has the excitation electrodes 5 the same as those in the sensor element 1, the detecting electrodes 7, and the plurality of wirings 19 connecting these electrodes to each other.

However, the sensor element 401 differs from the sensor element 1 in the mode of mounting with respect to a not shown mounting body. Specifically, the piezoelectric body 403 in the sensor element 401 has a projection portion 423 which projects from the frame part 17 to the outer side of the frame part 17 when viewed on a plane and a mounting part 425 which is connected to the front end of the projection portion 423. A plurality of pads 9 are provided on the mounting part 425. That is, in the present embodiment, in the same way as the second embodiment, the frame part 17 does not act as the portion bonded to a not shown mounting body, but the mounting part 425 provided on the outer side of the frame part 17 acts as the portion bonded to the mounting body.

The connection position of the projection portion 423 with respect to the frame part 17, the shape of the projection portion 423, the shape of the mounting part 425, the positions of the pads 9, and the like may be suitably set. In the example shown, they are as follows. The thickness of the piezoelectric body 403, for example, in the same way as the other embodiments, may be made substantially constant over its entirety (including the projection portion 423 and mounting part 425).

The projection portion 423 projects from the center of one of the pair of second extending portions 17b. The projection portion 423 for example projects with a constant width. The width of the projection portion 423 may be larger than, equal to, or smaller than the width of the frame part 17 (first extending portion 17a or second extending portion 17b). In the example shown, the width of the projection portion 423 is made broader than the width of the frame part 17.

The shape of the mounting part 425 is made a frame shape surrounding the frame part 17. The specific shape thereof is for example made rectangular in the same way as the frame part 17. From another viewpoint, the mounting part 425 is a shape extending along the periphery of the frame part 17. The mounting part 425 may be a similar shape or need not be a similar shape to the frame part 17. Further, the distance between the inner circumferential surface of the mounting part 425 and the outer circumferential surface of the frame part 17 (excluding the influence of the concave portions forming the narrow width portions 17*c*) may be constant or need not be constant. The widths of the mounting part 425 (widths of four sides) may be constant or may change. In the example shown, the mounting part 425 is made broader in the width in the long sides than the short sides. Further, the width of the mounting part 425 may be larger than, equal to, or smaller than the width of the frame part 17. In the example shown, the width of the mounting part 425 is made broader than the width of the frame part 17.

As described above, the piezoelectric body 403 includes a projection portion 423 which projects from the frame part 17 to the outer side of the frame part 17 when viewed on a plane and a mounting part 425 which is connected to the front end of the projection portion 423 and is provided with a plurality of pads 9.

Accordingly, for example, even if there is thermal stress between a not shown mounting body on which the sensor element 1 is mounted and the piezoelectric body 403, the position where that thermal stress acts upon the frame part 17 can be adjusted by the position of the projection portion 423. For example, the projection portion 423 can be made to project from the center of the second extending portion 17*b* to separate the projection portion 423 from the base part 11 connected to the centers of the first extending portions 17*a* as much as possible. From another viewpoint, compared with a case where neither the projection portion 423 nor the mounting part 425 is provided and the pads 9 are provided at the center of the second extending portion 17*b*, the action of the stress can be made the same while the pads 9 can be arranged at the four positions where the piezoelectric body 403 can be stably supported.

Further, in the present embodiment, all the pads 9 are provided in the mounting part 425, and there is a single projection portion 423 connecting the mounting part 425 and the frame part 17.

Accordingly, for example, even if the mounting part 425 is made to extend or contract in the x-axis direction or y-axis direction, the frame part 17 basically just changes in the position in the x-axis direction or y-axis direction. That is, almost no stress of the mounting part 425 is transferred to the frame part 17. Accordingly, even if there is thermal stress between the mounting part 425 and a not shown mounting body, hardly any of this thermal stress is transferred to the frame part 17.

Further, in the present embodiment, the mounting part 425 is a frame shape surrounding the frame part 17. Accordingly, the piezoelectric body 403 is kept from increasing in size while stable support of the sensor element 1 becomes possible.

Fifth Embodiment

Figure 10:
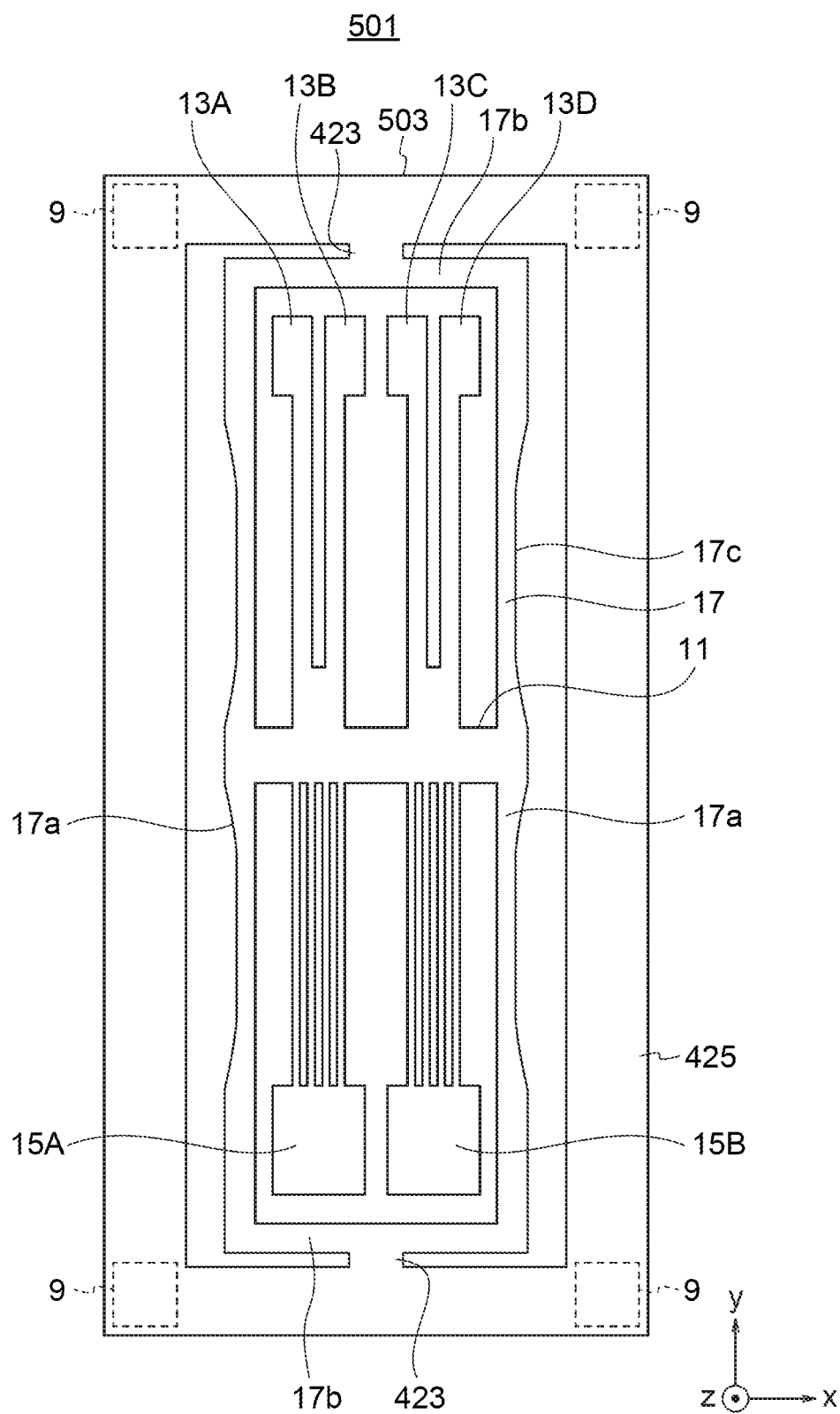
FIG. 10 is a plan view showing the configuration of a principal part of a sensor element according to a fifth embodiment.

FIG. 10 is a plan view showing the configuration of a principal part of a sensor element 501 according to a fifth embodiment.

The sensor element 501 differs from the sensor element 401 in the fourth embodiment only in the point that the number of the projection portions 423 in a piezoelectric body 503 is made two. The respective positions and/or relative positions of the two projection portions 423 may be suitably set. In the example shown, the two projection portions 423 are provided at inverse positions relative to each other (dyad symmetrical positions) with respect to the frame part 17.

In the present embodiment as well, the same effects as those by the fourth embodiment are exhibited. For example, even if the mounting part 425 extends or contracts in the direction (x-axis direction in the example shown) perpendicular to a straight line connecting the two projection portions 423, the frame part 17 basically just changes in the position in the x-axis direction. Accordingly, for example, the thermal stress between the frame part 17 and a not shown mounting body is mitigated.

Further, in the present embodiment, the frame part 17 is held at two points. Therefore, compared with the fourth embodiment in which the frame part is held at one point, for example, the frame part 17 can be stably held. Further, (at least) four wirings 19 which connect the excitation electrodes 5 and detecting electrodes 7 and four pads 9 must pass through one projection portion 423 in the fourth embodiment. However, in the present embodiment, two wirings 19 can pass through one of the two projection portions 423. As a result, for example, simplification of the wiring structure and/or broadening of widths of the wirings 19 (or narrowing of widths of the projection portions 423) becomes easy. In the fourth embodiment, compared with the fifth embodiment, for example the effect of mitigating the thermal stress is high.

In the above first to fifth embodiments, each of the driving arms 13 (13A to 13D) and 213 (213A to 213H) and the detecting arms 15 (15A and 15B) and 215 (215A and 215B) is one example of the arm parts. Each of the excitation electrodes 5 (5A and 5B) and detecting electrodes 7 (7A and 7B) and 307 (307A and 307B) is one example of the electrodes.

The present invention is not limited to the above embodiments and may be executed in various ways.

The frame part provided with the pads (first embodiment), the combination of the frame part and leg portions (second or third embodiment), and the combination of the frame part, projection portion, and mounting part (fourth or fifth embodiment) can be applied to piezoelectric vibration type angular velocity sensors of various vibration modes. For example, the frame part provided with the pads (first embodiment) or the combination of the frame part, projection portion, and mounting part (fourth or fifth embodiment) may be applied to the configuration of the new mode of vibration in the second or third embodiment as well. Further, the combination of the frame part and leg portions (second or third embodiment) may be applied to the configuration for the vibration mode of the first embodiment as well. Otherwise, for example, the frame part etc. may be applied to the configurations of various vibration modes other than the embodiments such as a mode in which a pair of driving arms and a pair of detecting arms extend from the base part alongside each other and a mode in which one driving arm and one detecting arm extend from the base part alongside each other (tuning fork shaped one).

The shape of the frame part is not limited to a rectangle and may be a shape including a curve or may be a polygon other than a rectangle. The same is true for the leg portions positioned at the periphery of the frame part (see the second or third embodiment) or frame shaped mounting part (see the fourth or fifth embodiment). The concave portions which are provided in the inner circumferential surfaces or outer circumferential surfaces of the frame part in order to make the widths narrower in single portions of the frame part may be shaped closer to notches (grooves or slits) than the shapes shown in the embodiments as well. Further, concave portions may be formed in the upper surfaces or lower surfaces of the frame part whereby portions absorbing vibration and/or shock may be formed. The connection position of the base part with respect to the frame part is not limited to the center of the frame part in the long direction. The connection position may be suitably set in accordance with the shape etc. of the piezoelectric body and may be biased in a predetermined direction relative to the frame part.

In the new mode of vibration in the second or third embodiment, two units need not be provided, only one unit may be provided. Further, the two units, converse to the embodiments, may be arranged so that the sides where the driving arms extend face each other or may be excited with inverse phases from each other. Between the two units, one may be provided for detection of the angular velocity around the x-axis as in the second embodiment, and the other may be provided for detection of the angular velocity around the z-axis as in the third embodiment.

In each unit realizing the new mode of vibration in the second or third embodiment, (at least) one pair of the driving arms and the detecting arm need not extend in the same direction (alongside each other). For example, one pair of driving arms extending to one side of the y-axis direction while one detecting arm extending to the other side of the y-axis direction may be provided as well.

In the new mode of vibration in the second or third embodiment, the number of the driving arms and the number of the detecting arms extending from one base part may be suitably combined. For example, a detecting arm extending to the positive side of the y-axis direction and a detecting arm extending to the negative side of the y-axis direction may be provided with respect to one pair of driving arms as well. Further, between one pair of driving arms, it is also possible to provide two or more detecting arms extending alongside each other.

Further, for example, two pairs of driving arms which extend from one base part to inverse sides from each other may be provided as well. In this case, one pair of driving arms extending to the +y side and one pair of driving arms extending to the −y side are excited so as to vibrate to inverse sides from each other in the x-axis direction (for example so that one pair of driving arms on the −y side become closer to each other at the time when one pair of driving arms on the +y side are separated from each other). Due to this, the moments from the two pairs of driving arms are applied to one base part.

The explanation of the second embodiment (FIG. 4) alluded to the fact that the leg portions 221 could be grasped as configured by the projection portions 223 and the mounting part 225. Further, in the fourth and fifth embodiments (FIG. 9 and FIG. 10), the projection portions 423 and the frame shaped mounting parts 425 were illustrated. In any case, as the projection portions, rectangular cuboid shaped ones were illustrated. However, the shapes of the projection portions are not limited to rectangular cuboid shapes. For example, they may be relatively thin and long shapes or may have bent portions. In this case, for example, the effect of mitigating the stress is improved.

In the above explanation, the rectangular cuboid shape parts at the roots in the leg portions 221 in the second embodiment were grasped as the projection portions 223. However, the projection portions only have to be portions projecting from the frame part. The mounting part only has to be portions which are connected with the front ends of the projection portions and be provided with pluralities of pads. Accordingly, a boundary between the projection portion and the mounting part may be suitably judged. For example, the leg portions 221 in FIG. 4 may be grasped to have a bent projection portion as well.

The sensor element or angular velocity sensor may be configured as a portion of an MEMS (micro electromechanical system). In this case, a piezoelectric body configuring the sensor element may be mounted on the substrate of the MEMS or the substrate of MEMS may be configured by a piezoelectric material and the piezoelectric body of the sensor element may be configured by a portion of the substrate.

REFERENCE SIGNS LIST

1 . . . sensor element, 3 . . . piezoelectric body, 5 . . . excitation electrode (electrode), 7 . . . detecting electrode (electrode), 11 . . . base part, 13 . . . driving arm (arm part), 15 . . . detecting arm (arm part), and 17 . . . frame part.

The invention claimed is:
1. A sensor element comprising,
a piezoelectric body
comprising one or more base parts and
at least one arm part extending from each of the one or more base parts in a plan view, and
a plurality of electrodes on a surface of the at least one arm part,
wherein
the piezoelectric body further comprises a frame part, wherein
the frame part comprises a frame sub-part, which does not include the one or more base parts,
the frame sub-part surrounds the one or more base parts and the at least one arm part and upon which the one or more base parts is or are bridged in the plan view,
a length of the one or more base parts in a first direction crossing an extension direction of the at least one arm part is longer than a length of the one or more base parts on the extension direction, and
two ends of each of the one or more base parts in the first direction are connected to the frame part,
the piezeoelectric body further comprises at least four mounting pads and one of the four mounting pads is located in each of four quadrants with respect to a center point in the plan view of the piezoelectric body, and
the at least four mounting pads are located on a surface of the piezoelectric body and are connected with the plurality of electrodes, wherein
the piezoelectric body further comprises:
a first projection portion projecting from the frame sub-part in a direction of the extension direction to a first outer side of the frame part in the plan view;
a second projection portion projecting from the frame sub-part in a direction opposite to the extension direction to a second outer side of the frame part in the plan view;
and
one or more first mounting parts which is or are connected with the first projection portion and on which at least a first one of the at least four mounting pads is located, and one or more second mounting parts which is or are connected with the second projection portion and on which at least a second one of the at least four mounting pads is located, wherein each of the one or more first and second mounting parts comprises a first part extending in a second direction and second part extending a third direction which is different from the second direction in the plan view, and the at least one arm part comprises one or more first arm parts extending from the one or more base parts to one side, and one or more second arm parts extending from the one or more base parts to a side opposite the one side, wherein the frame part surrounds the one or more base parts, the one or more first arm parts and the one or more second arm parts.

2. The sensor element according to claim 1, further comprising a plurality of wirings on a surface of the piezoelectric body, wherein the base part bridges the frame part in an x-axis direction in an orthogonal coordinate system xyz, each of the one or more first arm parts and the one or more second arm parts includes a pair of driving arms which extend alongside each other in a y-axis direction at positions separated from each other in the x-axis direction and a detecting arm which extends in the y-axis direction at a position which corresponds to a center between the pair of driving arms in the x-axis direction, the plurality of electrodes include a plurality of excitation electrodes in an arrangement enabling application of voltages exciting the pair of driving arms in the x-axis direction and a plurality of detecting electrodes in an arrangement enabling detection of a signal generated due to vibration in the x-axis direction or a z-axis direction of the detecting arm, and the plurality of wirings connect the plurality of excitation electrodes so that voltages having phases inverse from each other are supplied from the plurality of excitation electrodes to the pair of driving arms so that the pair of driving arms bend to inverse sides from each other in the x-axis direction and thereby vibrate.

3. The sensor element according to claim 2, wherein the plurality of detecting electrodes are located in an arrangement enabling detection of the signal generated due to bending deformation in the z-axis direction of the detecting arm.

4. The sensor element according to claim 2, wherein the plurality of detecting electrodes are located in an arrangement enabling detection of the signal generated due to bending deformation in the x-axis direction of the detecting arm.

5. The sensor element according to claim 1, wherein the piezoelectric body further comprises a plurality of leg portions which extend from the frame part to outer sides of the one or more first mounting parts and the one or more second mounting parts in the plan view and on which the at least four mounting pads are located.

6. The sensor element according to claim 5, wherein at least one of the plurality of leg portions comprises a portion extending along at least a portion of a periphery of the frame part between the frame part and one of the at least four mounting pads.

7. The sensor element according to claim 5, wherein at least one of the plurality of leg portions comprises a portion extending while being folded back between the frame part and one of the at least four mounting pads.

8. The sensor element according to claim 1, wherein:

all of the at least four mounting pads are located on the mounting part, and there are the frame sub-part connecting the mounting part and the frame part.

9. The sensor element according to claim 1, wherein the one or more first mounting parts and the one or more second mounting parts is a frame shape surrounding the frame part.

10. The sensor element according to claim 1, wherein:

the frame part comprises a pair of extending portions which face each other in the x-axis direction and upon which the base part is bridged, and each of the pair of extending portions comprises a part narrower in width of the x-axis direction.

11. An angular velocity sensor comprising:

the sensor element according to claim 1, a driving circuit supplying voltage to part of the plurality of electrodes, and a detecting circuit detecting a signal from the other part of the plurality of electrodes.

12. A sensor element comprising, a piezoelectric body further comprising one or more base parts and at least one arm part extending from each of the one or more base parts in a plan view, and a plurality of electrodes on a surface of the at least one arm part, wherein the piezoelectric body further comprises a frame part, wherein the frame part comprises a frame sub-part, which does not include the one or more base parts, the frame sub-part surrounds the one or more base parts and the at least one arm part and upon which the one or more base parts is or are bridged in the plan view, a length of the one or more base parts in a first direction crossing an extension direction of the at least one arm part is longer than a length of the one or more base parts on the extension direction, and two ends of each of the one or more base parts in the first direction are connected to the frame part, the piezeoelectric body further comprises at least four mounting pads and one of the four mounting pads is located in each of four quadrants with respect to a center point in the plan view of the piezoelectric body, wherein the piezoelectric body further comprises an outside part extending from the frame part to an outside of the frame part, wherein the at least four mounting pads are located on the outside part and the outside part comprises a first projection portion projecting from the frame sub-part in a direction of the extension direction to a first outer side of the frame part in the plan view and;

a second projection portion projecting from the frame sub-part opposite to the extension direction to a second outer side of the frame part in the plan view;

one or more first mounting parts, which is or are connected with the first projection portion, and on which at least a first one of the at least four mounting pads is located and one or more second mounting parts which is or are connected with the second projection portion and on which at least a second one of the at least four mounting pads is located, wherein;

each of the one or more first and second mounting parts comprises a first part extending in a second direction and second part extending a third direction which is different from the second direction in the plan view, and the at least one arm part comprises one or more first arm parts extending from the one or more base parts to one side, and one or more second arm parts extending from the one or more base parts to a side opposite the one side, wherein the frame part surrounds the one or more base parts, the one or more first arm parts and the one or more second arm parts.

\* \* \* \* \*